United States Patent
Dolan

(10) Patent No.: US 11,415,997 B1
(45) Date of Patent: Aug. 16, 2022

(54) AUTONOMOUS DRIVING SIMULATIONS BASED ON VIRTUAL SIMULATION LOG DATA

(71) Applicant: Zoox, Inc., Foster City, CA (US)

(72) Inventor: James Graham Dolan, Foster City, CA (US)

(73) Assignee: Zoox, Inc., Foster City, CA (US)

( * ) Notice: Subject to any disclaimer, the term of this patent is extended or adjusted under 35 U.S.C. 154(b) by 151 days.

(21) Appl. No.: 16/834,459

(22) Filed: Mar. 30, 2020

(51) Int. Cl.
*G05D 1/02* (2020.01)
*G01C 21/34* (2006.01)

(52) U.S. Cl.
CPC ....... *G05D 1/0221* (2013.01); *G01C 21/3407* (2013.01)

(58) Field of Classification Search
CPC .......................... G05D 1/0221; G01C 21/3407
USPC .......................................................... 701/27
See application file for complete search history.

(56) References Cited

U.S. PATENT DOCUMENTS

| | | | | |
|---|---|---|---|---|
| 2016/0314224 A1* | 10/2016 | Wei | .......................... | G06F 30/20 |
| 2018/0276912 A1* | 9/2018 | Zhou | ...................... | G07C 5/085 |
| 2020/0050536 A1* | 2/2020 | Nygaard | ............. | G06F 11/3692 |
| 2020/0247412 A1* | 8/2020 | Wang | .................... | H04W 4/023 |

* cited by examiner

*Primary Examiner* — Paula L Schneider
(74) *Attorney, Agent, or Firm* — Lee & Hayes, P.C.

(57) ABSTRACT

A driving simulation system may perform simulations using one or more of a virtual driving simulator or a log-based driving simulator. A log-based simulator may replay data from logs to test whether a control algorithm is successfully capable of navigating a scenario. However, when such log-based simulations are invalid (e.g., based on the results of the simulations or evaluations of conditions of the simulation), a virtual simulation may be generated for the vehicle control system during which new log data may be captured. Such a virtual simulation may comprise sensor simulations and more sophisticated object control for ensuring convergence to a scenario to be tested. The new log data may be used for additional log-based simulations, thereby improving the durability and flexibility for testing and/or validation, while reducing the computational overhead of driving simulation scenarios.

20 Claims, 8 Drawing Sheets

AUTONOMOUS DRIVING SIMULATIONS BASED ON VIRTUAL SIMULATION LOG DATA

BACKGROUND

Simulated data and simulations can be used to test and validate the features and functionalities of systems, including features and functionalities that may be otherwise prohibitive to test in the real world (e.g., due to safety concerns, limitations on time, repeatability, etc.). For example, autonomous vehicles and other moving vehicles may use driving simulations to test and improve passenger safety, vehicle decision-making, sensor data analysis, and route optimization. However, driving simulations that accurately reflect real-world scenarios may be difficult to create, as data used to create such simulations may be noisy, inconsistent, and/or incomplete. Additionally, driving simulations may involve multiple different systems and components interacting in a real-time simulated environment, which may be resource and computationally expensive.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
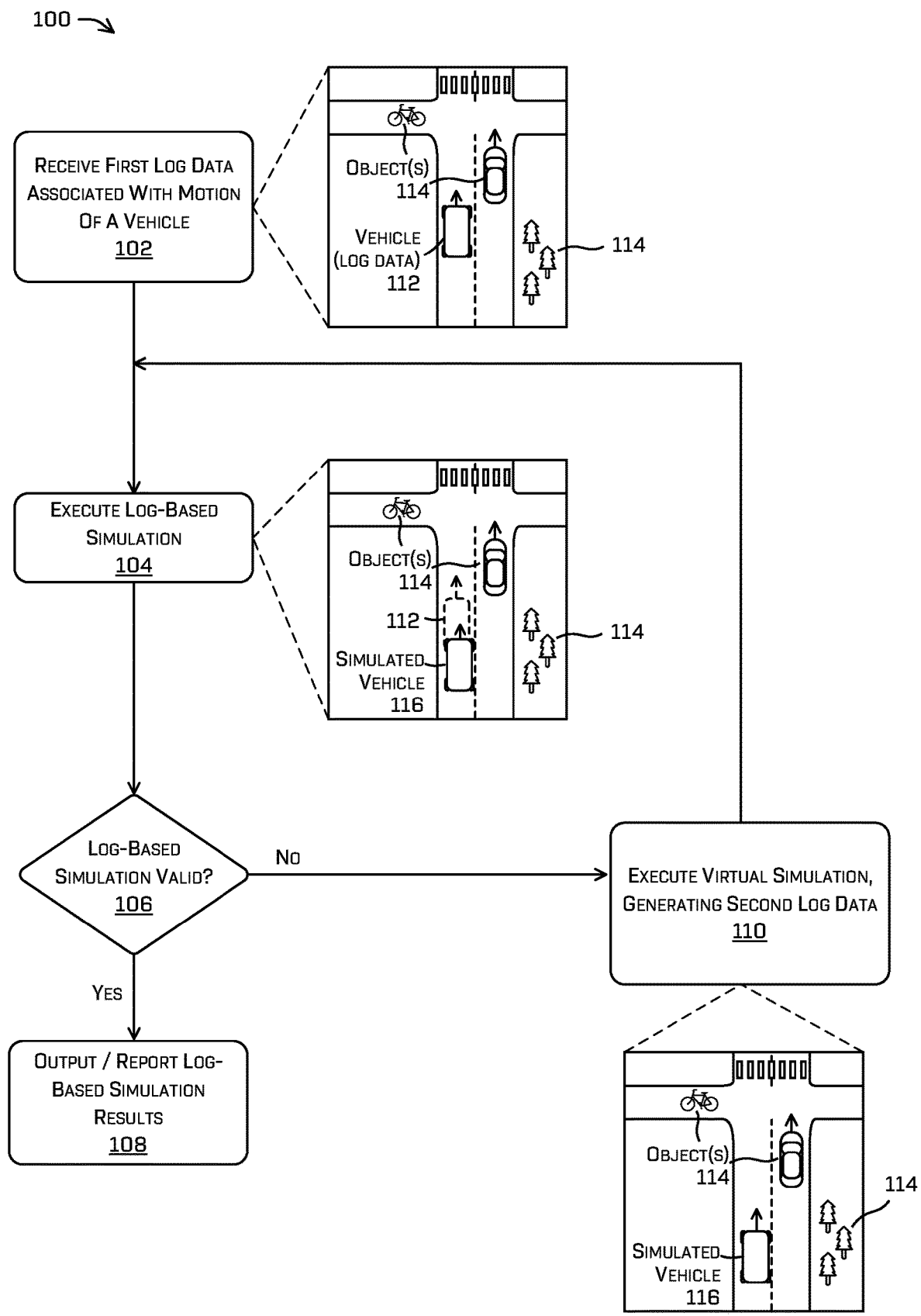
FIG. 1 illustrates an example process of executing driving simulations and generating new log data for log-based driving simulations, in response to a determination that a log-based simulation is invalid, as described herein.

This disclosure describes techniques for creating and executing driving simulations to test and validate vehicle control systems. In some examples, the driving simulation systems described herein interact with vehicle control systems during virtual driving simulations and/or log-based driving simulations. Log-based driving simulations may be performed using log data captured previously by a real or simulated vehicle traversing a real or simulated environment. A simulation system may determine when a log-based simulation is invalid, for example, based on a modification to the vehicle control system or associated vehicle configuration. In response to determining that a log-based simulation is invalid, the simulation system may generate and execute a virtual driving simulation using the modified vehicle control system/vehicle configuration. New log data may be generated and captured during the virtual driving simulation, and the new log data may be used to generate new log-based simulations. By updating the log data for simulation scenarios using virtual simulations, the simulation system may perform more robust and flexible driving simulation scenarios, including increased re-usability and utility of log-based simulation scenarios, and more resource efficient execution of simulation scenarios.

The purpose of driving simulations can be to test and validate the responses of a simulated vehicle to a variety of different simulated scenarios for later use in the real world. For example, driving simulations may model normal or abnormal driving conditions and/or vehicle conditions, using a variety of simulated environments and simulated objects or agents. Driving simulations may model various different traffic conditions, environmental conditions, roadway obstructions, accidents, etc., to test and validate passenger safety, vehicle routing, decision-making, efficiency, etc. Certain simulations may test the responses of the simulated vehicle to defective and/or faulty sensors on the vehicle. Some driving simulations may be used to test individual components or systems of the simulated vehicle (e.g., a sensor data perception component, a decision-making or planning component, etc.), while other driving simulations may test the simulated vehicle as a whole including interactions between the various components or systems of the vehicle. Such simulations may comprise scenarios which rarely occur in the real world, yet still require testing to validate safe operation, as well as provide a mechanism to consistently test variations for control algorithms keeping all other factors constant.

In some examples, a driving simulation system may perform virtual driving simulations, in which a simulated vehicle may interact with a simulated objects in a simulated virtual environment. In virtual driving simulations, the simulated objects within the environment may include software-based objects including artificial intelligence(s) and/or other algorithms that can react to the actions of simulated vehicle, while the simulated vehicle also reacts to the simulated objects and to the conditions of the simulated environment. Virtual simulations may provide highly realistic testing and validation for real-world driving scenarios, by executing all of the simulated components (e.g., simulated vehicle(s), objects, and environment) concurrently within the virtual environment and supporting communications and interactions between the simulated components.

However, virtual simulations also may be resource intensive and computationally expensive, which may limit the number and utility of the simulation scenarios that can be executed within a computing environment. For example, when creating a virtual simulation environment to perform testing and validation, a simulation system may specifically instantiate the environment with various and specific examples. Each instantiation of such an environment can be unique and defined. Enumerating all possible scenarios manually can require inordinate amounts of time and, if not every possible scenario is constructed, various scenarios can go untested. Additionally, even though many different virtual simulation scenarios can be instantiated, there is no guarantee that the additional scenarios provide any additional, useful, information. For example, incremental differences in starting positions of simulated vehicles at an intersection can only provide marginal, if any, additional useful information about the ability of a simulated autonomous vehicle to respond in the scenario given a particular set of computer code.

In contrast to virtual simulation systems, log-based simulations may use previously collected log data to generate the simulated objects and environment in which to test the simulated vehicle. Log-based simulations may rely on previously recorded sensor data from a system operating in an environment, such as an autonomous vehicle traversing an environment (which may include occasions of controller disengagement or other challenging scenarios), to provide driving simulation scenarios for testing and validation purposes.

When a real vehicle traverses a real environment, or a simulated vehicle traverses a simulated environment in a driving simulation, the real or simulated vehicle may generate log data associated with the environment. In some examples, log data may include raw sensor data and/or data based on sensor data (e.g., bounding boxes, velocities, classifications, object dimensions, predictions, object track information, control signals, etc.). Examples of data generated by a vehicle that can be included in the log data can be found, for example, in U.S. patent application Ser. No. 15/644,267, titled "Interactions Between Vehicle and Teleoperations System," filed Jul. 7, 2017 (describing communication signals that can include sensor data and data indicating an occurrence of an event as well vehicle control data that can be derived from data received from a sensor and a planner, an object data calculator, an object classifier, a collision predictor system, a kinematics calculator, a safety system actuator, and a control operation of the drive system), U.S. patent application Ser. No. 15/693,700 titled "Occupant Protection System Including Expandable Curtain and/or Expandable Bladder" and filed Sept 1, 2017 (describing data representative of a trajectory of the vehicle, location data, object data, and vehicle control data, and U.S. patent application Ser. No. 16/198,653 titled "Executable Component Interface and Controller" filed Nov. 21, 2018 (describing a type of log data), which are each incorporated by reference in their entirety.

To generate log-based driving simulations, the log data captured by a real or simulated vehicle can be used to generate simulation instructions that, when executed by a simulator, generate the simulated environment. The log data can include sensor data captured by one or more sensors of the vehicle or can include data based on such sensor data. For example, log data can include, but is not limited to, one or more of perception data indicating objects identified by one or more systems onboard the vehicle (or produced during a post-processing phase), prediction data indicating an intent of objects (whether produced during the recording or subsequent thereto), and/or status data indicating diagnostic information, trajectory information, and other information generated by the vehicle.

When generating the simulation instructions, a scenario generator of the log-based simulation system can identify objects represented in the log data. For example, the scenario generator can use perception data to determine the objects within the environment. The objects can include static objects (e.g., buildings, trees, road surfaces, road markers, signage, etc.) and dynamic objects (e.g., vehicles, pedestrians, animals, bicyclists, motorcycles, etc.). Additional object attributes or parameters can be determined and used to instantiate the objects in a log-based simulation. For instance, the object extent can indicate a size and/or volume of the object (e.g., a length, a width, and/or a height in meters). The object classification can indicate a classification and/or type of the object (e.g., a vehicle, a pedestrian, a bicyclist, etc.). The object pose can indicate an object's x-y-z coordinates (e.g., a position or position data) in the environment and/or can include a pitch, a roll, and/or a yaw associated with the object. The object trajectory can indicate a trajectory followed by the object.

To generate a log-based driving scenario, the vehicle that initially collected the log data can transmit the log data, via a network, to a database that stores log data and/or to a computing device executing a scenario generator and simulator (also referred to as a scenario generator). As discussed above, the log data can include perception data that identifies objects (e.g., roads, sidewalks, road markers, signage, traffic lights, other vehicles, pedestrians, cyclists, animals, etc.) and/or bounding boxes that represent the objects. The scenario generator can use the log data to generate simulation instructions to simulate a scenario. For example, the environment (e.g., roads, buildings, signage, etc.) traversed by the vehicle can be represented as a simulated environment in the simulated scenario. The simulated scenario can be identical to the captured environment or deviate from the captured environment. For example, the simulated environment can have more or fewer number of buildings as in the captured environment. Additionally, objects (e.g., other vehicles, pedestrians, animals, cyclists, etc.) in the log data can be represented as simulated objects and the vehicle can be represented as a simulated vehicle. In at least some examples, such simulated data may comprise only information about static and dynamic entities (e.g., exclusive of buildings, roads, etc.). In such examples, the simulated environment may comprise previously generated (or otherwise available) maps and/or representations of the recorded environment.

The simulated vehicle can represent an autonomous vehicle that is controlled by a vehicle control system that can determine a trajectory, based at least in part, on the simulated environment. In such an example, the same and/or similar systems may be tested in software and/or hardware.

Certain log data, which may be initially collected by a real vehicle traversing a real environment, or a simulated vehicle traversing a simulated environment, can include an event of interest. In some instances, an event of interest can include detecting a collision with another object, a violation of a traffic rule (e.g., a speed limit), and/or a disengagement where a human driver takes control of the operation of the vehicle from an autonomous controller. In some instances, an event of interest can include an error condition and/or a warning such as a low battery power event. Further, an event of interest can include a lane change, a change of direction (of object(s) in the environment), a change in velocity (of object(s) in the environment), and the like.

In some instances, the scenario generator (e.g., within a log-based simulation system) can determine an amount of interaction between the simulated vehicle and the objects. For purposes of illustration only, the log data can indicate that the vehicle performed a lane change action, a turning action, and/or an acceleration action, etc. based on a detection of an object, an action associated with the object, and/or a predicted action associated with the object. In some instances, the log-based simulation system can omit objects from the simulated scenario that do not meet or exceed a threshold level of interaction with the vehicle. By excluding objects that do not meet or exceed the threshold level of interaction with the vehicle, the scenario generator of the log-based simulation system can reduce an amount of computational resources required to generate and execute the log-based simulation.

However, in some examples, instantiating and executing log-based simulations with log data may cause other errors and/or lead to invalid tests. For instance, when executing a log-based driving simulation for a vehicle control system, based on log data collected by a different vehicle control system, the simulated vehicle might not interact with the simulated environment and objects traversing the environment as intended. An updated planning algorithm, vehicle capabilities, sensors and/or sensor configuration may result in the simulated vehicle responding substantially differently to the log-based simulation than would the vehicle that captured the initial log data. Accordingly, while log-based simulations may provide resource and computational efficiencies, they may be less accurate than virtual driving simulations, and may become invalid if the position or actions of the simulated vehicle differ substantially from the vehicle that initially collected the log data.

Accordingly, the techniques described herein include determining that a log-based driving simulation is invalid, and in response, performing a virtual driving simulation for a modified vehicle control system to generate new (e.g., updated) log data. The new log then may be used to generate and execute additional log-based driving simulations. In some examples, a simulation system may receive first log data associated with a vehicle traversing an environment. The first log data may be captured by a real vehicle traversing a real environment and/or by a simulated vehicle during a previously executed virtual driving simulation. The simulation system may create and execute a log-based driving simulation based on the first log data. Based on responses to the log-based simulation, from the simulation system and/or the vehicle control system(s), the simulation system may determine that the log-based simulation is invalid. For instance, differences between the vehicle control system of the simulated vehicle and the vehicle control system used to collect the log data, may cause the position of the simulated vehicle to diverge substantially from the expected position based on the log data, may cause a scenario in which the event being tested does not occur due to relative timing, or otherwise causes one or more objects instantiated to behave in a manner that does not provide any useful data for testing and validation of the one or more control algorithms.

In response to the determination that the log-based simulation is invalid, the simulation system may execute a new virtual driving simulation using the updated vehicle control system. During the virtual driving simulation, the updated vehicle control system may control the simulated vehicle within a similar or identical simulation scenario to the scenario from which the first log data was collected. For instance, the three-dimensional simulated environment, simulated agents and objects, behaviors, etc., may be constant across the different virtual driving simulations. Some or all of the agents in a virtual simulation may be programmatic agents (e.g., artificial intelligence-based or other intelligent agents) which are configured to act in the simulation in accordance with their behavioral programming. Such agents may use the programming in the same manner and may be re-instantiated at the same location and temporal starting point during each virtual simulation. New log data may be captured during the new virtual driving simulation, so that differences between the first log data and the newly captured log data may be attributed to the updated vehicle control system. Using the new log data, the simulation system may generate and execute additional log-based simulations, which may be valid when run using the updated vehicle control system.

In some examples, the techniques and/or systems described herein may improve the operation of simulation systems and the quality and efficacy of driving simulations. For example, by determining that a log-based simulation is invalid and then performing a new virtual driving simulation to generate new log data, greater numbers of resource-efficient log-based tests may be performed for a simulation scenario. Additionally, the log-based simulation techniques described herein may be performed sequentially on different components of the simulated vehicle, which may require less memory and computational resources than virtual simulations requiring all of the components of the simulated vehicle and additional simulation objects to be instantiated and executed at the same time. Regeneration of log data using an updated vehicle control system may improve the longevity of valuable log-based simulations, by making the simulations adaptable to changes in the simulated vehicle behavior configuration. Additionally, the higher-cost virtual driving simulations can be executed less frequently, allowing for higher quality sensor simulation data to be generated and cached for use in the virtual simulations.

The methods, apparatuses, and systems described herein may be implemented in a number of ways. Example implementations are provided below with reference to the following figures. Although discussed in the context of an autonomous vehicle, in some examples, the methods, apparatuses, and systems described herein may be applied to a variety of systems. In another example, the methods, apparatuses, and systems may be utilized in semi-autonomous or non-autonomous vehicles, and/or in an aviation or nautical context.

FIG. 1 illustrates an example process 100 for executing a virtual driving simulation and generating new log data for a log-based driving simulation, in response to a determination that the log-based simulation is invalid. In some examples, some or all of example process 100 may performed by driving simulation system(s), such as virtual driving simulator and/or log-based driving simulator, as described in more detail below. Example process 100 may be described below with reference to driving simulations, during which a simulated vehicle may move through a simulated environment receiving input from and responding to the simulated environment and simulated agents/objects therein. Additionally, some portions of example process 100 may be omitted, replaced, and/or reordered while still providing the functionality of generating virtual and log-based driving simulations, and generating new log data based on determinations that a log-based simulation is invalid.

At operation 102, a driving simulation system may receive first log data associated with the motion of a vehicle 112. In some examples, the first log data may comprise data captured by the vehicle 112 during operation of the vehicle 112 in an environment. For instance, the first log data may be captured by a vehicle control system of a real vehicle 112 traversing through a real environment, or a vehicle control system controlling a simulated vehicle 112 within a previous virtual simulation. The first log data may include raw sensor data and/or data based on sensor data detected at the vehicle 112, for example, data identifying characteristics of the environment in which the vehicle was operated, objects 114 within the proximity of the vehicle, attributes or characteristics of the environment and objects (e.g., classifications, sizes, shapes, positions, trajectories, etc.). In some instances, the first log data may correspond to particular events or behaviors of the objects 114 observed by the vehicle, such as accidents or near accidents, traffic violations, crossing or jaywalking by pedestrians, cyclists, or animals, weather anomalies, construction zones, detours, school zones, etc.

These particular events or behaviors may be designated from a list of events/behaviors that are desirable for use as driving simulations. In some examples, the particular events or behaviors may be identified from the vehicle's log data, either automatically by the object detection and analysis systems of the vehicle, and/or by input by a passenger of the vehicle flagging and/or labeling the particular event or behavior.

At operation 104, the driving simulation system may create and execute a log-based simulation, based on the first log data. As discussed above, log-based simulations may be generated based on previously collected log data, and may simulate the previously detected vehicle environment and objects from the log data for the simulated vehicle 116. A scenario generator within the simulation system, or remotely accessible via a network, may identify objects represented in the log data, and generate simulation instructions to simulate a similar or identical environment and objects. During log-based simulations, the simulated vehicle 116 may be controlled by a vehicle control system (or vehicle controller) which may control the behavior of the vehicle 116 in response to the simulated environment and objects. However, because the previously collected log data is fixed and unchanging, the simulated environment and any agents/objects within the simulated environment may be unable to react or respond to the behaviors of the simulated vehicle 116 in the log-based simulation. In some examples, log-based simulations need not be executed for an entire simulated vehicle. For instance, the driving simulation system may load and instantiate one or more particular components of the vehicle control system, for targeted testing of the particular components or subsystems. In this way, a vehicle's components and subsystems may be tested sequentially during a log-based simulation, rather than simultaneously (or substantially simultaneously) as they would be during a virtual driving simulation. Sequential testing of a vehicle's components via repeated log-based testing may provide advantages for targeted simulation testing, and for reducing the memory and computing requirements for simulation systems.

At operation 106, the driving simulation system may determine whether the log-based simulation executed at operation 104 is valid. In some examples, the invalidity of a log-based simulation may be caused by a difference in one or more components of the simulated vehicle 116 and the vehicle 112 associated with the received log data. For instance, if the vehicle 116 simulated during the log-based simulation is controlled by a first vehicle control system, and the vehicle 112 that captured the initial log data is controlled by a second vehicle control system different from the first vehicle control system (e.g., having one or more different hardware components or configurations, software algorithms or versions, configuration setting, etc.), then the simulated vehicle 116 might interact with the simulated environment and objects in a different manner than did the vehicle 112 that initially collected the log data. By way of non-limiting example, the differences between vehicle control systems that may cause log-based simulations to become invalid may include updates the vehicle's planning algorithm, driving capabilities, sensors, sensor positions or configurations, etc.

In some examples, the driving simulation system may determine that a log-based simulation is invalid for the vehicle control system simulating the vehicle, based on responses received to the simulation from the simulation system or from the vehicle control system of the simulated vehicle 116. For instance, the control system of the simulated vehicle 116 may analyze the simulated environment and/or objects during the simulation to determine object consistency, jerkiness, driving patterns and speeds, etc., and may compare one or more of these factors to threshold(s) to determine whether the simulation is valid or invalid. In some examples, the vehicle control system and/or the driving simulation system may determine that the simulation is invalid based at least in part on the performance of the simulated vehicle during the simulation. For instance, when a simulated vehicle 116 fails a relatively large number of behavior or performance tests during a log-based simulation, in comparison to the expected performance of the simulated vehicle 116, then the driving simulation system may determine that the failures are caused by the log-based simulation being invalid for the simulated vehicle 116.

Figure 2B:
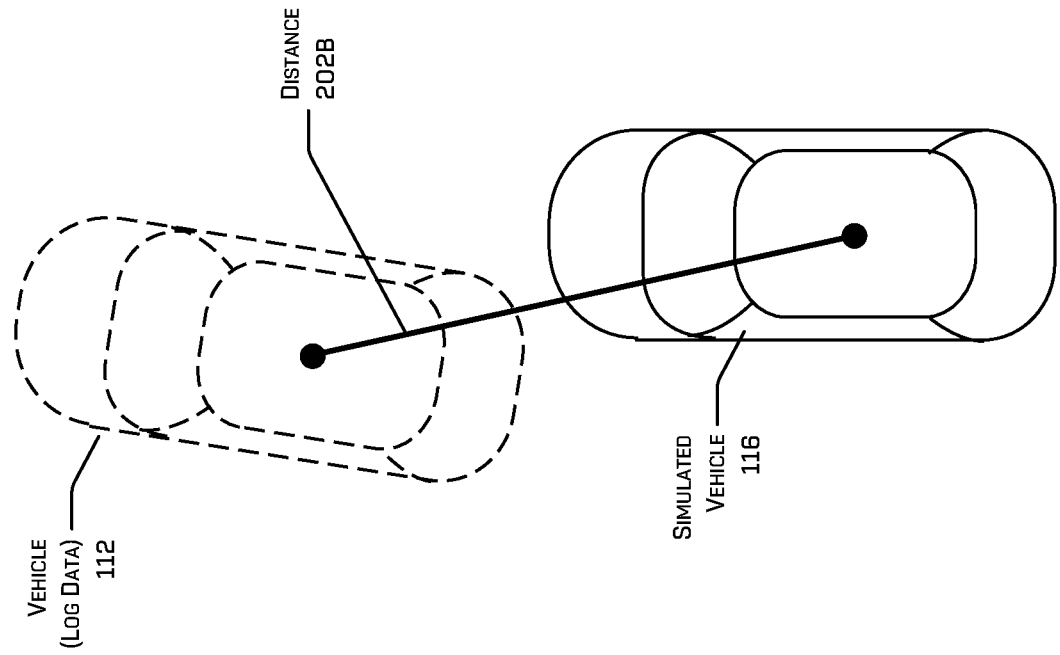
FIGS. 2A and 2B illustrate two examples of positional discrepancies between simulated vehicles during log-based driving simulations, as described herein.
Figure 2A:
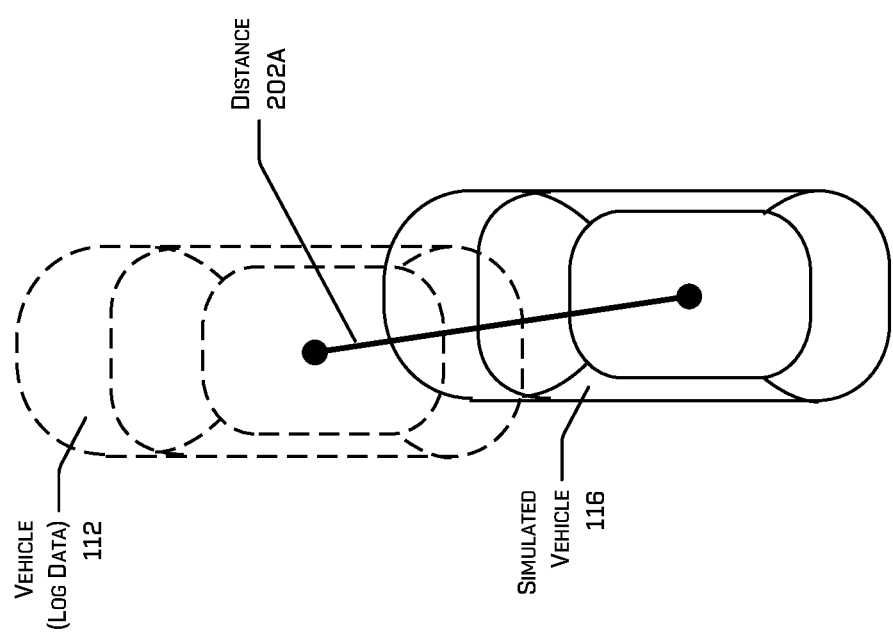

The vehicle control system of the simulated vehicle 116 and/or the driving simulation system also may determine that a log-based simulation is invalid based on the distance between the simulated vehicle 116 and the vehicle 112 that initially collected the log data, at a corresponding point in time. For example, referring briefly to FIGS. 2A-2B, two examples are shown of transposed sets of vehicles 112 and simulated vehicles 116, showing the distances 202 between the sets of vehicles at a corresponding time during the log-based simulation. In some instances, the log data captured by vehicle 112 and simulated vehicle 116 may include time and position data identifying the location of the vehicles 112, 116 within their respective environments. The relative locations of the vehicles 112, 116 also may be computed in some cases based on additional sensor data, such as the distances, angles, and detection times of common objects identified within the log data and the corresponding log-based simulation. The driving simulation system may calculate and monitor the distance between vehicles 112 and 116 during the log-based simulation, and may compare the distance to a predetermined threshold to determine whether the log-based simulation is valid or invalid. For instance, FIG. 2A shows a relatively small distance 202A indicating that the simulated vehicle 116 has drifted a relatively small amount from the path taken by the vehicle 112 when collecting the log data. In contrast, FIG. 2B shows a relatively larger distance 202B indicating that the simulated vehicle 116 has drifted a larger amount from the path taken by the vehicle 112. Accordingly, in this example, the log-based simulation in FIG. 2A may be determined valid for the simulated vehicle 116, while the log-based simulation in FIG. 2B may be determined invalid for the simulated vehicle 116.

Additionally or alternatively, the simulation system may use various other techniques to determine if log-based simulations are invalid. For example, instead of (or in addition to) using the distance between the vehicle from the log data and the simulated vehicle from the log-based simulation, as described above, the simulation system also may compare the pose, velocity, acceleration, vehicle orientation, and/or direction of travel of the different vehicles. For instance, the simulation system may determine the orientation of the vehicle from the log data and compare that to the orientation of the simulated vehicle from the log-based simulation. If the difference in orientation meets or exceeds a threshold, the simulation system may determine that the log-based simulation is invalid. The simulation system may perform similar comparisons between the bi-directional orientation, the direction of travel, the velocity, and/or the acceleration of the vehicle from the log data and the corresponding bi-directional orientation, direction of travel, velocity, and/or acceleration of the simulated vehicle from the log-based simulation. Such determinations, performed for the vehicle from the log data, and the simulated vehicle from the log-based simulation, may be performed at matching or associated times (e.g., a first time in the log data and a matching corresponding second times within the log-based simulation).

In still other examples, a determination at operation 106 that a log-based simulation is invalid, may be based either on the simulated vehicle failing the simulation and/or the simulated vehicle being contacted unexpectedly by an object or agent during the simulation. For instance, a simulation system may distinguish between typical simulation failures (e.g., where the simulated vehicle does not respond as expected to the simulation scenario), and invalid simulations (e.g., where the simulated environment is incompatible with the simulated vehicle, a simulated agent or object contacts the simulated vehicle within the simulated environment, etc.).

Additionally, in some examples, a simulation system may determine that a log-based simulation is invalid based on differences in the characteristics or configuration settings of the vehicle in the log data and the simulated vehicle in the log-based simulation. For instance, if the vehicle in the log data and the simulated vehicle have different sensor types, different sensor configurations, different vision modes (e.g., day mode versus night mode), then the simulation system may determine that log-based simulation is invalid for the simulated vehicle. In such cases, the simulation system may potentially determine that log-based simulation is invalid even without needing to generate/execute the log-based simulation. Furthermore, although the above examples for determining when a log-based simulation is invalid are described individually, it is contemplated that any of these techniques may be performed in any combination as a compound determination of invalidity of log-based simulations.

When the driving simulation system determines that the log-based simulation is valid (106:Yes), the driving simulation system may output and/or report the results of the simulation at operation 108. As noted above, the simulation results may identify the behaviors or performance of the simulated vehicle 116 during the simulation. When the log-based simulation is one of a batch or sequence of simulations, the process may return to operation 104 to execute the next simulation in the batch or sequence using the same log data and same vehicle control system for the simulated vehicle 116.

Alternatively, in response to determining that the log-based simulation is valid (106:Yes), the driving simulation system may execute an updated virtual simulation at operation 110, using the same control system as the simulated vehicle 116 in the previous log-based simulation. During the execution of the virtual simulation at operation 110, the vehicle control system and/or driving simulation system may capture new log data associated with the simulation. As noted above, the control system of vehicle 116 may be different than the control system of vehicle 112, for instance, including updates to a planner or decision-making algorithm, updates to the vehicle sensors or sensor configurations, etc. Accordingly, the new log data, captured during the updated virtual simulation using the control system of the simulated vehicle 116, may account for any updates or differences between the control systems of vehicles 112 and 116. Thus, when the new/updated log data captured in operation 110 is used to perform a subsequent log-based simulation in the next iteration of operation 104, the simulated vehicle 116 and vehicle 112 associated with the log data may have same controllers, and the log-based test may be determined to be valid.

During the virtual simulation at operation 110, and each subsequent iteration of operation 110, the virtual simulation may correspond to a similar or identical simulation scenario from which the first (or previous) log data was received at operation 102. In some examples, the virtual simulations associated with operations 102 and 110 may include a similar or identical three-dimensional simulated environment, agents and objects, events, behaviors, etc. By generating new virtual simulations with the same simulation details held constant across the virtual driving simulations (e.g., similar or identical simulated environment, similar or identical agent objects, similar or identical behaviors, etc.), the differences in the new log data may be attributable to the updates between the control systems of vehicles 112 and 116. Using the new log data received from operation 110, the driving simulation system may generate and execute an additional log-based simulation at operation 104, which may be valid for at least the vehicle control system of the simulated vehicle 116.

In the example process 100 described above, operation 110 may include generating new log data (also referred to as second log data) after determining that a log-based simulation is invalid. However, in other examples, rather than generating new log data the simulation system may identify and retrieve previous log data from a previous simulation in operation 110. For instance, if a simulation system has performed the loop depicted in process 100 multiple times, and has generated multiple different log data in response to previous invalidations of log-based simulations, the simulation system may store each of previous log data (e.g., in log data store 308). In operation 110, before generating new log data, the simulation system may analyze each of the previously stored log data to determine if any of the previous log data is valid for the log-based simulation. The review and determination of previously stored log data may be similar or identical to the invalidity check performed in operation 106. For instance, the simulation system may determine the location of the vehicle in a set of previously stored log data with the location of the simulated vehicle in the log-based simulation, to determine whether the previously stored log data may be used for a valid log-based simulation with the current simulated vehicle. In some cases, the simulation system may analyze multiple previous log data (e.g., based on the distances between the vehicle in the log data and the simulated vehicle), to determine which of the previous log data is optimal for a log-based simulation using the simulated vehicle. Instead of, or in addition to distance between the vehicle in the log data and the simulated vehicle, the simulation system may use any of the other techniques described herein for selecting previous log data in operation 110, rather than generating new log data.

Figure 3:
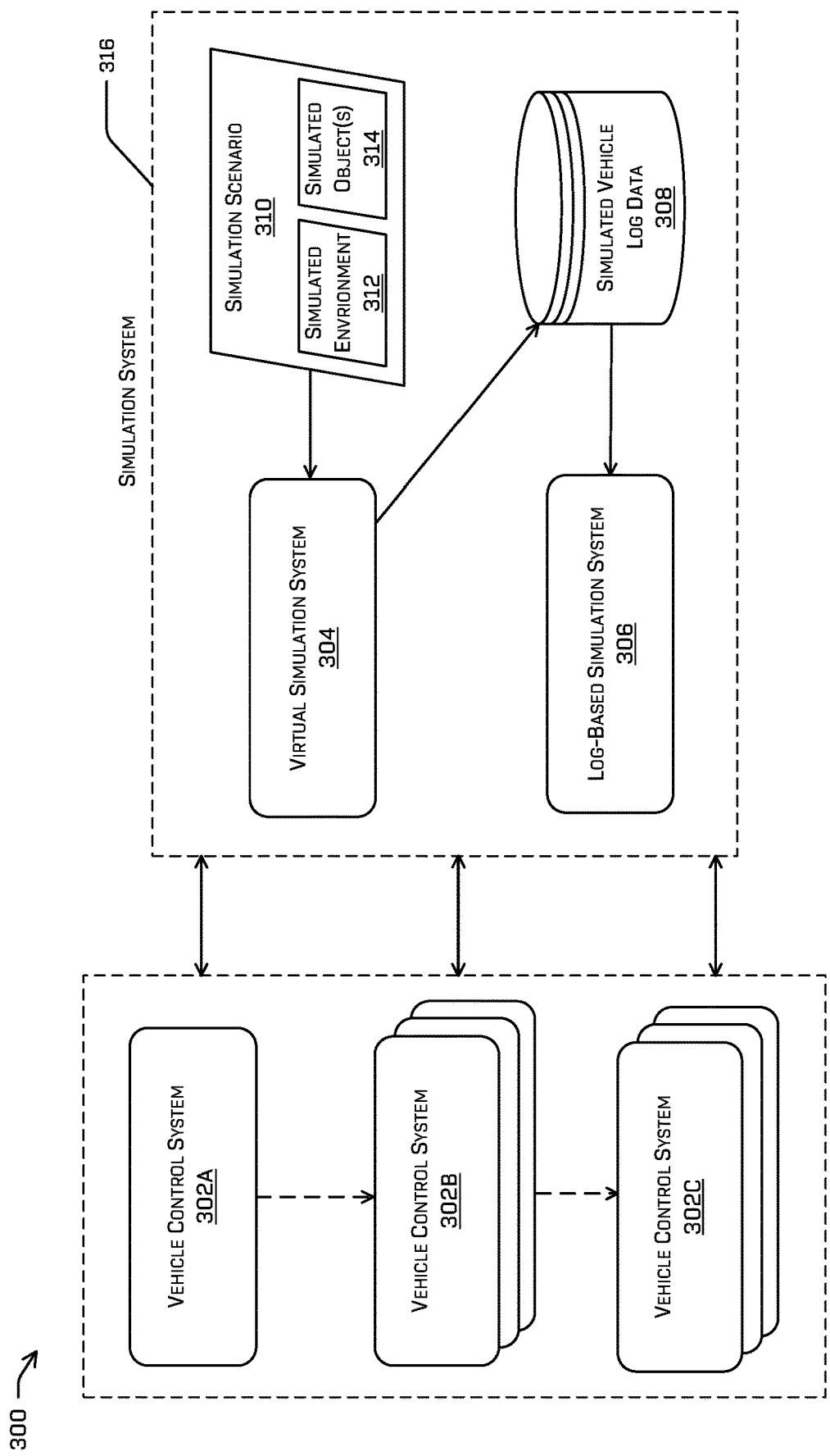
FIG. 3 includes a block diagram of an example architecture for performing virtual and log-based driving simulations, as described herein.

FIG. 3 depicts an example computing architecture including a virtual simulation system and log-based simulation system for performing driving simulations on vehicle control systems. In some examples, a computing architecture similar or identical to computing architecture 300 may be used to execute process 100. For instance, vehicle control system 302 may operate to control a physical vehicle traversing an environment, or may operate independently of a physical vehicle but may control a simulated vehicle 116 within a simulated environment. The vehicle control system 302 may include similar or identical components and architecture as the example vehicle control system 702 depicted in FIG. 7, described below in more detail.

As shown in FIG. 3, the vehicle control system 302 need not remain static over time, but may represent a complex and changing system of interacting hardware, software, and network components. For instance, vehicle control system 302A may represent a first version of the vehicle control system 302, vehicle control system 302B may represent a second version of the vehicle control system 302 including one or more updates or modifications to the first version, vehicle control system 302C may represent a third version of the vehicle control system 302 including additional updates or modifications to the second version, and so on. Each new version of the vehicle control system 302 may include one or more updates to the hardware components, software components, and/or configuration of the system, such as updated vehicle sensors, updated sensor configurations, updated sensor data processing software, updated planning or decision-making algorithms, updated map routes, etc. As noted above, each change to a vehicle control system 302 may have the potential to alter the behavior of the vehicle control system 302 during a log-based simulation, relative to the behavior of a previous version of the same vehicle control system 302.

Example computing architecture 300 also includes a simulation system 316, including a virtual simulation system 304 and a log-based simulation system 306. In this example, the virtual simulation system 304 and log-based simulation system 306 are depicted as separate computing systems which may operate independently in different computing environments, different hardware, different networks, etc. In other examples, the virtual simulation system 304 and log-based simulation system 306 may be implemented as different components or functionalities within the same computing system (e.g., simulation system 316), which may be similar or identical to the components and architecture of the example simulation system 732 depicted in FIG. 7.

As shown in this example, the virtual simulation system 304 may perform a first virtual driving simulation using a first version of the vehicle control system 302A. The log data associated with the first virtual driving simulation, which may be captured and/or generated by the vehicle control system 302A and/or the simulation system 316, may be stored in log data store 308. The log data store 308 can be integrated into the memory of one or more of the simulation system 316, the virtual simulation system 304, the log-based simulation system 306, and/or the vehicle control system 302 in various examples. To execute the virtual driving simulation, virtual simulation system 304 can retrieve and instantiate simulated objects from a simulated scenario 310, including a simulated environment 312 and one or more simulated object(s) 314. The virtual simulation system 304 may receive, load, and instantiate a simulated vehicle based on the vehicle control system 302A, the simulated environment 312, and simulated object(s) 314, each of which may be executed as separate and independent programmatic objects (e.g., artificial intelligence(s) and/or other software-based objects) that can communicate with each other and react to the simulated environment 312 and the actions of the other simulated vehicles/objects during the virtual simulation.

Figure 4:
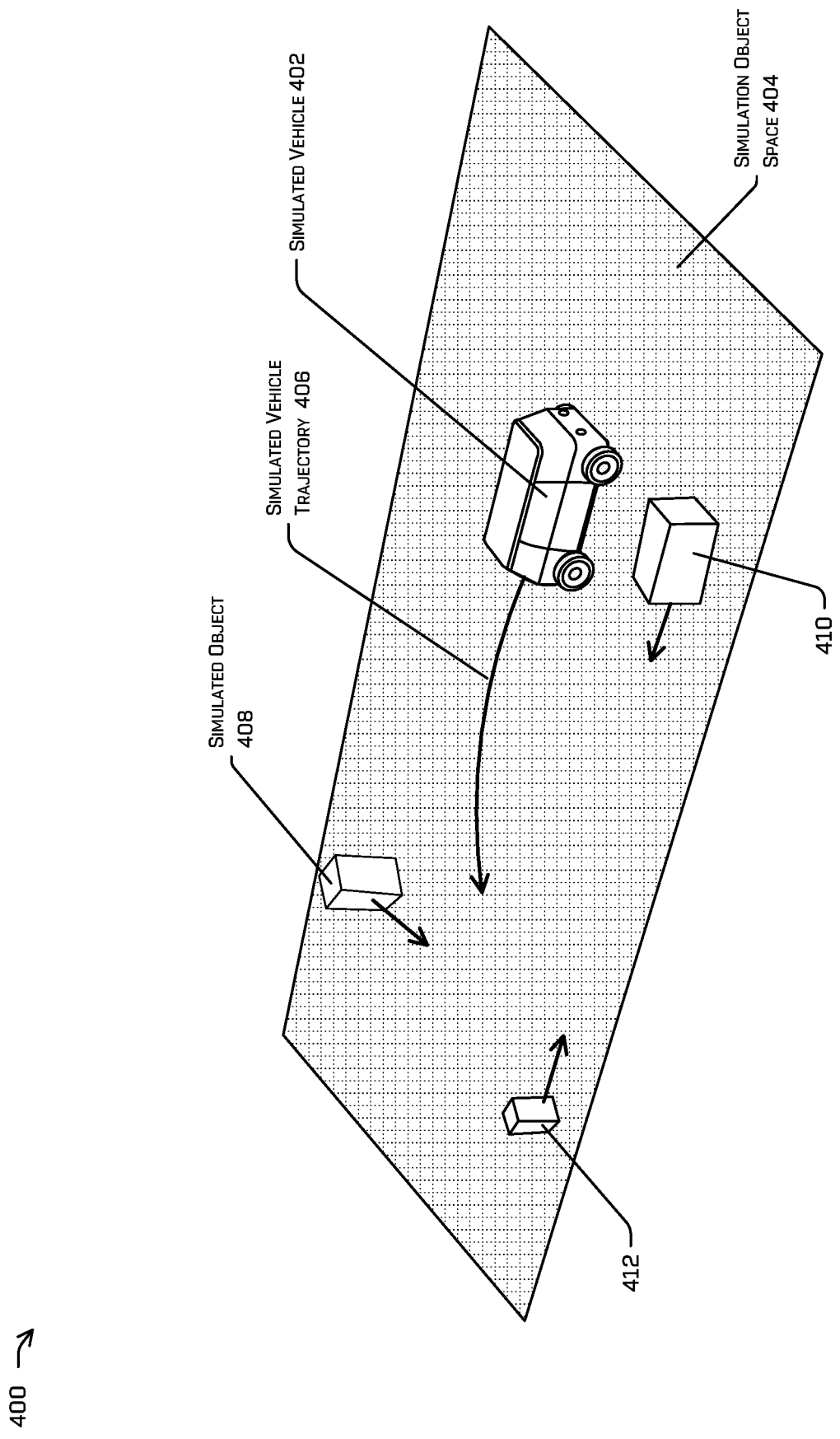
FIG. 4 illustrates an example rendering of a virtual driving simulation, including a simulated vehicle and simulated objects within a simulated environment, as described herein.

Referring briefly to FIG. 4, an example virtual simulation environment 400 is shown representing a virtual simulation that may be executed by a virtual simulation system 304. In this example, the virtual simulation system 304 may instantiate and execute a simulated vehicle 402 operating within a simulated object space 404. The simulated vehicle 402 is moving within the object space 404 at a trajectory 406. The virtual simulation system 304 also may instantiate and execute any number of simulated objects 408, 410, and 412 within the virtual environment 400. During the virtual simulation, the virtual simulation system 304 may simultaneous instantiate and execute each of the simulated vehicle 402, environment 400, object space 404, and simulated objects 408, 410, 412. Each simulated object 408-412 can have a unique set of attributes or characteristics, such as the object classification, size, position, pose, velocity, trajectory, etc. Additionally, within the virtual simulation, each of the simulated vehicle 402, object space 404, and simulated objects 408, 410, 412 may be defined and controlled by independent object/agent algorithms, which may include artificial intelligence (AI) based algorithms, random behavior modifications, or any other programmatic control. Each simulated vehicle or object during the virtual simulation may move and behave within the simulated environment 400 in accordance with its object/agent programming, and each simulated vehicle or object may react to the actions and behaviors of other simulated vehicles and/or objects within the simulated environment 400. Additionally, the virtual simulation system 304, while generating a virtual simulation, may instantiate and control each of the intelligent agents and their respective behaviors, to converge toward a desired or expected behavior for testing and validating the simulated vehicle within the simulated environment 400.

After the first virtual simulation has been executed, the first log data captured or generated based on the first virtual simulation may be used to create and execute subsequent log-based simulations. As shown in this example, the log-based simulation system 306 may retrieve the first log data from the log data store 308, and may execute one or more batches of log-based simulations using the first log data. The log-based simulation system 306 may use the first log data to generate simulation instructions for the log-based simulation, and then may execute the log-based simulation for the vehicle control system. In some examples, batches of hundreds or thousands of vehicle simulations can be run using the same log-based simulation. For instance, different simulations may test different individual components of the vehicle control system 302 (or different combinations of components), different configurations or operation modes of the simulated vehicle, different starting speeds, positions, or trajectories of the simulated vehicle, etc.

As noted above, when a log-based simulation is executed repeatedly over time, the behaviors of the vehicle control system 302 may change across different executions of the simulation. Changes to the system systems or sensors configuration used by the vehicle control system 302, updated planning or decision-making algorithms, updated map routes, changes to configuration settings, and/or other changes to the vehicle control system 302 may cause the simulated vehicle to behave differently during the execution of the log-based simulation. As shown in this example, the log-based simulation system 306 may execute a batch of simulations on the second version of the vehicle control system 302B, and another batch of simulations on the third version of the vehicle control system 302C. As described above in reference to FIG. 1, if the vehicle control system 302 and/or the log-based simulation system 306 determines that any of the simulations executed for the second or third versions of the vehicle control system 302B or 302C is invalid, then the log-based simulation system 306 may initiate an updated virtual simulation by the virtual simulation system 304 using the updated/current version of the vehicle control system 302.

Figure 5:
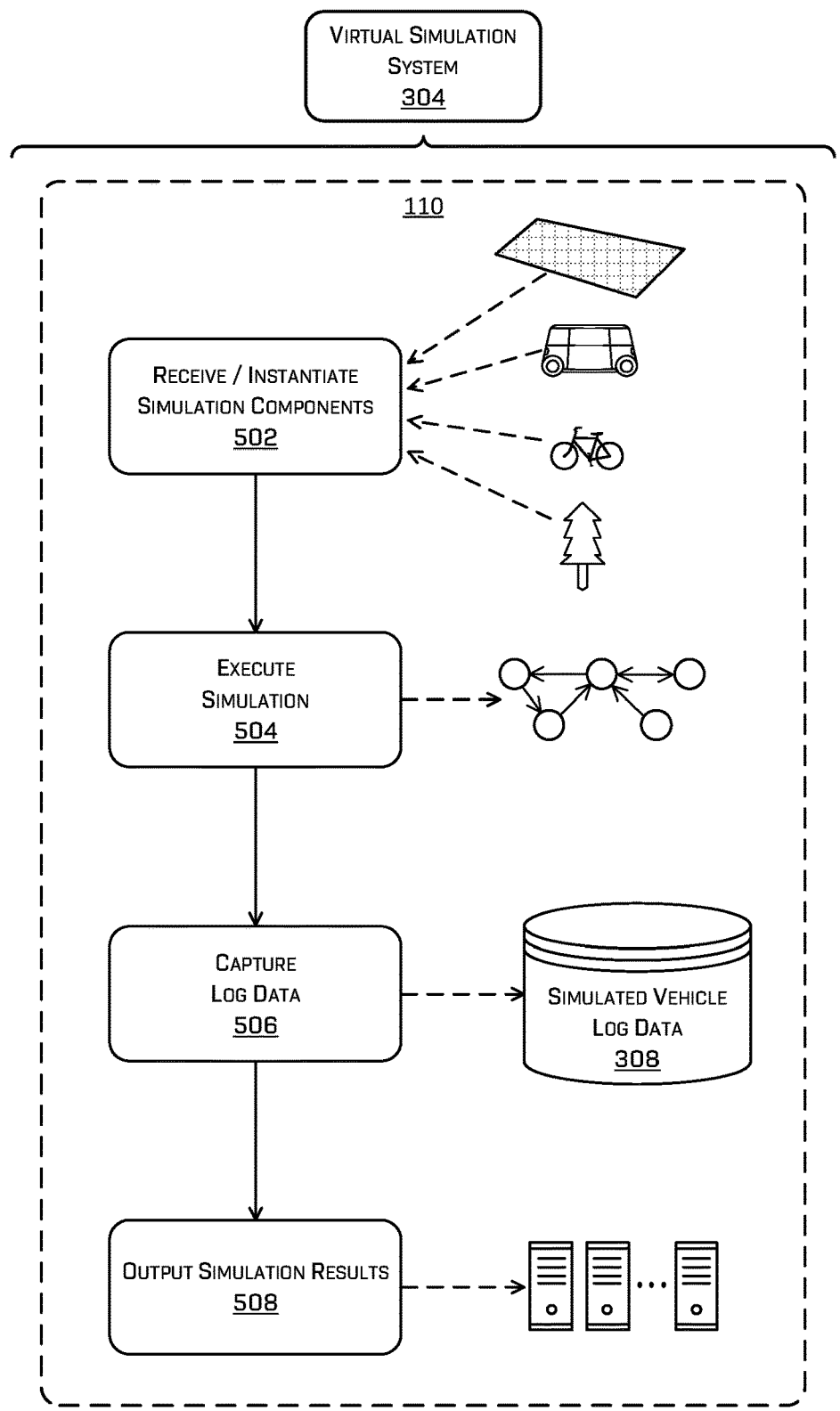
FIG. 5 illustrates an example process of executing a virtual driving simulation, as described herein.

FIG. 5 illustrates an example process 500 for executing a virtual driving simulation. Example process 500 may be performed, for instance, by a virtual simulation system 304 such as described in connection with FIG. 3, and/or by a simulation system 732 such as described in connection with FIG. 7.

At operation 502, the virtual simulation system 304 may receive and instantiate one or more simulation environment(s), vehicle(s) and object(s), to be simulated during the virtual simulation. In some examples, each of simulation environment 312, the simulated objects 314, and the simulated vehicle(s) 116 may comprise one or more independent software components having independent code bases, executables, and configuration data. The software components instantiated by the virtual simulation system 304 at operation 502 may be received from and controlled by different remote computing systems.

At operation 504, the virtual simulation system 304 may execute the virtual simulation, which may comprise concurrently executing each of the software components instantiated at operation 502 for the simulation environment, simulated vehicles, and simulated objects. As noted above, each simulated vehicle and object may be implemented and controlled by an independent software component, which may determine the particular object attributes, behaviors, and motivations of the associated simulated vehicle or object. In some examples, a simulated vehicle or objects in a virtual simulation may include an artificial intelligence and/or other algorithms to control the attributes, behaviors, and motivations of the vehicle or object, and also may control the interactions between different vehicles and/or objects during the simulation. To execute the virtual simulation, the virtual simulation system 304 may execute each of the individual software components within a shared virtual computing environment. The virtual simulation system 304 also may track and monitor each of the simulated vehicles and objects during the simulation, including any interactions between the simulated vehicles and objects within the simulated environment.

At operation 506, the virtual simulation system 304 may receive and/or capture the log data associated with a simulated vehicle 116 during the virtual simulation. Although the virtual simulation may include multiple simulated vehicles and other objects, the log data may be associated with a particular simulated vehicle 116, and may include sensor data (and/or data based on the sensor data) detected by the vehicle control system 302 for the simulated vehicle 116 during the simulation. The log data may be similar or identical to log data captured by a real vehicle operating the same vehicle control system 302, and traversing a real environment identical to the environment of the virtual simulation. In some examples, the log data may be initially captured and/or generated by the components of the vehicle control system 302 executing on the virtual simulation system 304, and then provided to a log data component of the virtual simulation system 304 and/or transmitted to the log data store 308.

At operation 508, the virtual simulation system 304 may output the simulation results, indicating the behaviors and/or performance of the simulated vehicle 116 during the virtual simulation. Different driving simulations may be used to test components of the vehicle control system 302, and/or may different types of behaviors or vehicle performance. By way of non-limiting example only, the virtual simulations may have success or failure thresholds and/or other performance metrics associated with passenger safety, vehicle planning and decision-making, navigation and vehicle routing, driving efficiency, object detection and recognition, etc. The output of the behaviors and/or performance of the simulated vehicle 116 may relate to any component(s) of the vehicle control system 302 and/or other measurable behavior of the simulated vehicle 116 during the virtual simulation.

Figure 6:
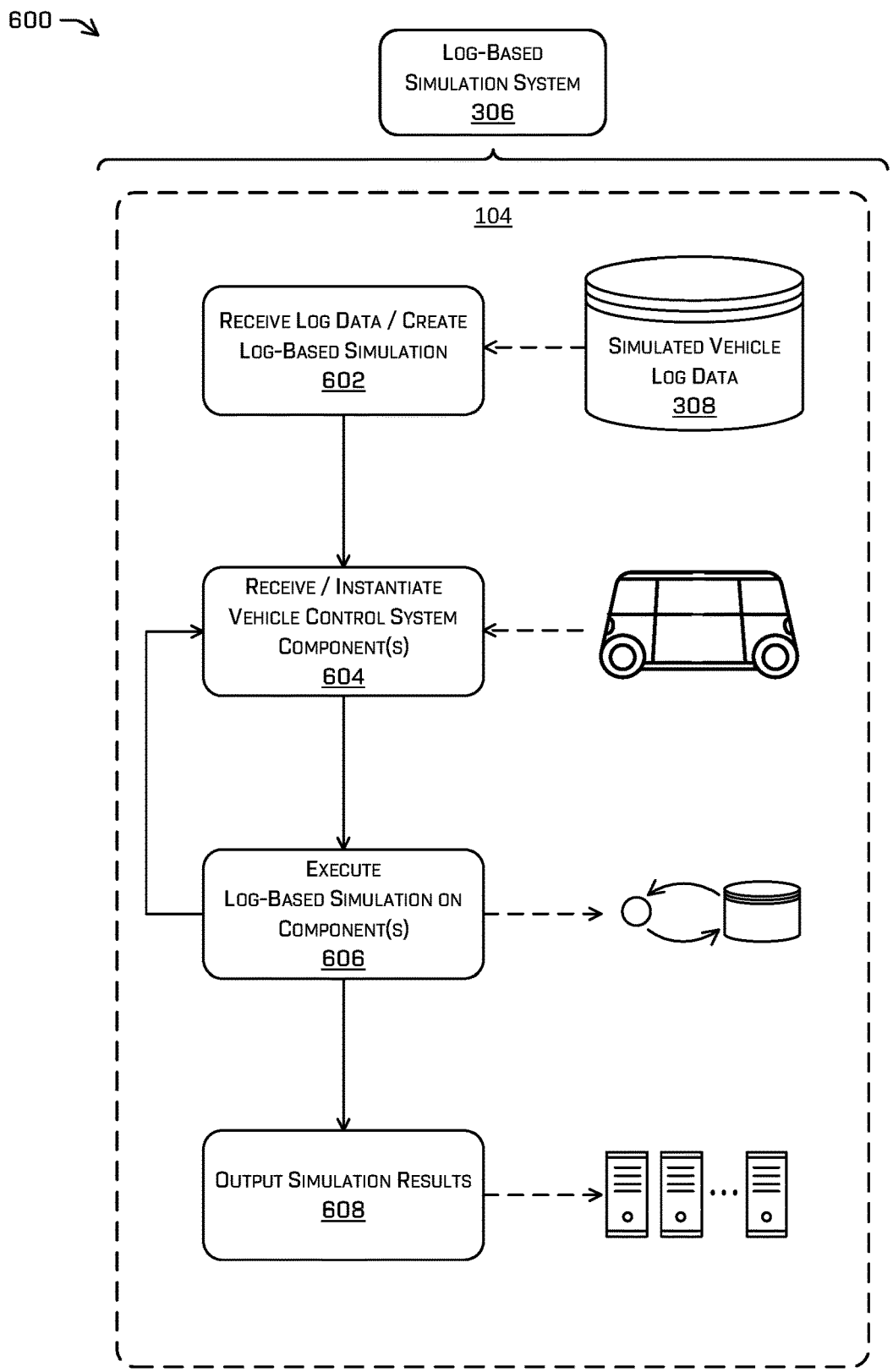
FIG. 6 illustrates an example process of executing and evaluating a log-based driving simulation, as described herein.

FIG. 6 illustrates an example process 600 for executing a log-based driving simulation. Example process 600 may be performed, for instance, by a log-based simulation system 306 such as described in connection with FIG. 3, and/or by a simulation system 732 such as described in connection with FIG. 7.

At operation 602, the log-based simulation system 306 may receive log data from a log data store 308, and generate a log-based simulation using the log data. As discussed in connection with FIG. 3, the log data retrieved by the log-based simulation system 306 may correspond to the same log data associated with the simulated vehicle 116 from the virtual simulation executed by the virtual simulation system 304. In some examples, the log-based simulation system 306 may use a scenario generator to generate simulation instructions based on the received log data.

At operation 604, the log-based simulation system 306 may receive and instantiate one or more components of a vehicle control system 302 to be tested during the log-based simulation. Unlike the instantiation of software components for virtual simulations described above at operation 502, in operation 604 the log-based simulation system 306 may instantiate one or more individual components of the vehicle control system 302 for individual component testing, rather than instantiating the entire vehicle control system 302 for a virtual simulation. Additionally, in some examples, the log-based simulation system 306 need not instantiate software components/objects corresponding to a simulated environment 312 or simulated objects 314, as the simulation environment and objects for the log-based simulation may be determined from the previously collected log data. However, it is also contemplated that a log-based simulation system 306 may instantiate one or more programmatic agents or objects (e.g., artificial-intelligence based agents) during a log-based simulation. For instance, the log-based simulation system 306 may generate the simulated environment 312, simulated objects 314, and may add to the simulated environment 312 one or more intelligent agents whose actions are not based merely on the log data but are independently determined at least in part based on the programmatic behaviors of the intelligent agents.

At operation 606, the log-based simulation system 306 may execute the log-based simulation for the component(s) of the vehicle control system 302 instantiated at operation 604. The log-based simulation may comprise executing the instantiated components of the vehicle control system 302 and providing input to the components based on the simulation instructions associated with the log data. It may be noted that, unlike the execution of virtual simulations described above in operation 504, log-based simulations need not require interactions between different software components representing the simulated environment, simulated vehicles, and simulations. As noted above, the simulated vehicle 116 (and/or individual vehicle components) may react in response to the inputs received during the log-based simulation, but the simulated environment and objects may be fixed and not responsive to any behaviors of the simulated vehicle 116. Accordingly, the log-based simulation system 306 may track and monitor the behaviors and performance of the simulated vehicle 116 (and/or individual vehicle components) but need not track or monitor the simulation environment or other simulated objects during the log-based simulation. As shown in this example, process 600 may comprise batch executions of log-based simulation, and/or sequential executions for individual testing of the components of the vehicle control system 302, as represented by the loop between operations 604 and 606.

At operation 608, the log-based simulation system 306 may output the simulation results, indicating the behaviors and/or performance of the simulated vehicle 116 during the log-based simulation. Operation 608 may be similar or identical to operation 508, during which any of the behaviors and/or performance data of the simulated vehicle 116 described above may be stored and/or output by the vehicle control system 302 and/or the log-based simulation system 306.

Figure 7:
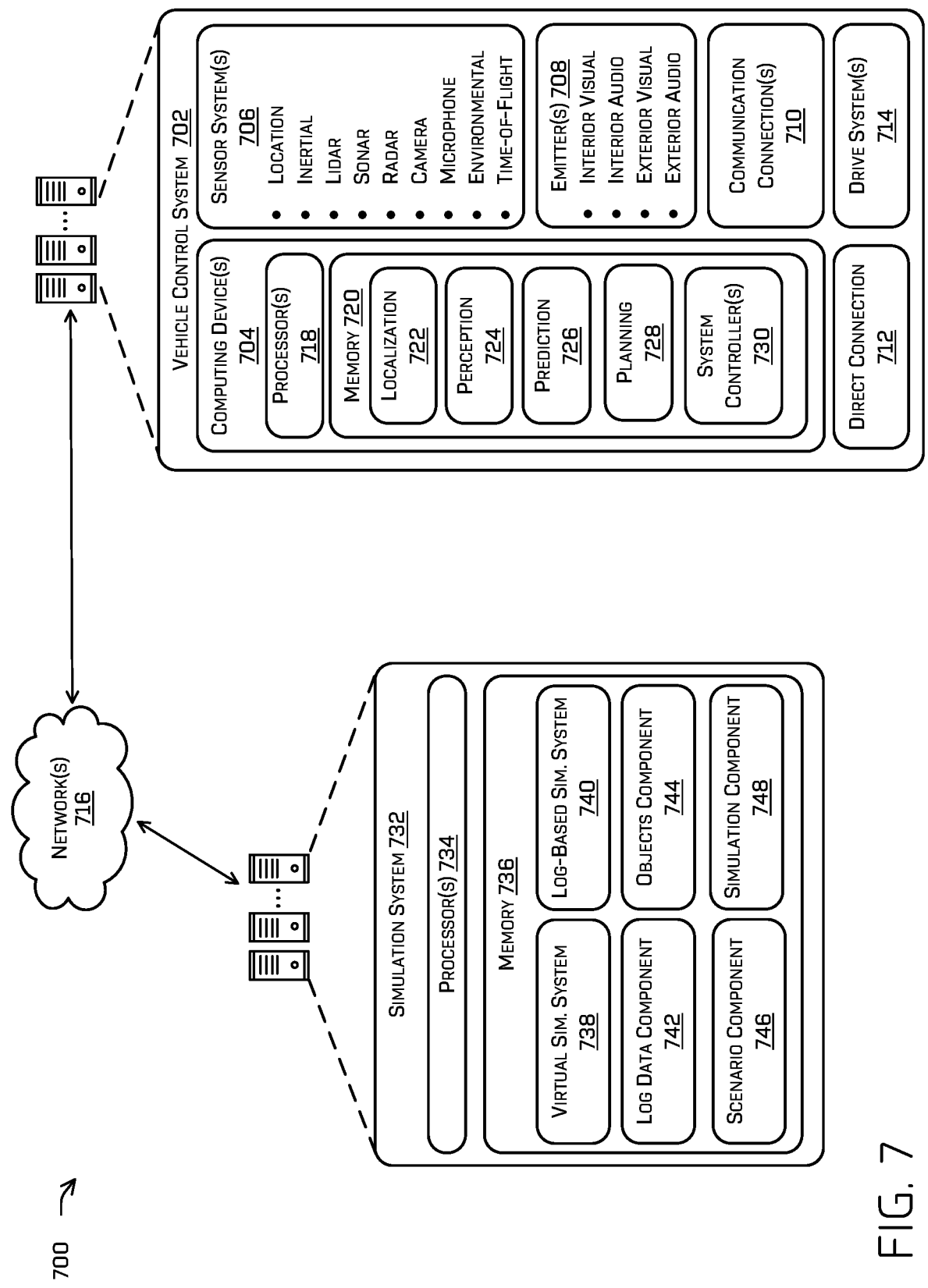
FIG. 7 includes a block diagram of an example architecture of a vehicle control system and a simulation system for performing driving simulations, as described herein.

FIG. 7 illustrates an example computing environment 700 that may be used to implement the driving simulation systems according to the techniques described herein. The computing environment 700 may include a simulation system 732 and a vehicle control system 702. In this example, the simulation system 732 may include a virtual simulation system 738 and a log-based simulation system 740. The virtual simulation system 738 may perform virtual driving simulations such as those described above in process 500, and the log-based simulation system 740 may perform log-based driving simulations such as those described above in process 600. As noted above, virtual simulation systems 738 and log-based simulation systems 740 may be implemented within a single simulation system 732, as in this example, or may be implemented in separate computer systems as shown in computing architecture 300.

The vehicle control system 702 may include various software-based and/or hardware-based components of an autonomous vehicle, and may be used to control autonomous vehicles traversing through physical environments and/or simulated vehicles operating within virtual and/or log-based simulations. The vehicle control system 702 may be similar or identical to simulated vehicles 118 and 402 and/or vehicle control system(s) 302.

In this example, the vehicle control system 702 and the simulation system 732 and are illustrated as discrete computing systems communicating over one or more networks 716, although in other implementations the functionality of each of the systems 702, 732, may be carried out in the same computing environment. By way of non-limiting example, software executing the functionality of the vehicle control system 702 may be uploaded or otherwise incorporated into the simulation system 732 and/or software executing the simulation system 732 may be uploaded to or otherwise made incorporated into the vehicle control system 702.

The vehicle control system 702 can be a hardware-based and/or software-based controller for a driverless vehicle, such as an autonomous vehicle configured to operate according to a Level 5 classification issued by the U.S. National Highway Traffic Safety Administration, which describes a vehicle capable of performing all safety-critical functions for the entire trip, with the driver (or occupant) not being expected to control the vehicle at any time. In some instances, the vehicle control system 702 may operate within a real associated vehicle, such as a fully or partially autonomous vehicle having any other level or classification. In some instances, the techniques described herein for the may be usable by non-autonomous vehicles as well. Additionally or alternatively, the vehicle control system 702 may operate independently from any vehicle, for example, as a hardware and software-based controller for a simulated vehicle executing in a computing environment during the development, testing, and validation processes for the vehicle control system 702. In addition, while implementations of the vehicle control system 702 described herein may include simulating a control system of an autonomous vehicle, semi-autonomous vehicle, or a non-autonomous vehicle, some of the techniques may be in a simulated environment, using a simulated vehicle.

The vehicle control system 702 can be used for any configuration of real or simulated vehicles, such as, for example, a van, a sport utility vehicle, a cross-over vehicle, a truck, a bus, an agricultural vehicle, and/or a construction vehicle. For instance, the associated vehicle for the vehicle control system 702 can be powered by one or more internal combustion engines, one or more electric motors, hydrogen power, any combination thereof, and/or any other suitable power sources. Although the associated vehicle may have four wheels, the vehicle control system 702 and associated techniques described herein can be incorporated into vehicles having fewer or a greater number of wheels, and/or tires. The vehicle control system 702 can control vehicles having four-wheel steering and can operate generally with equal or similar performance characteristics in all directions, for example, such that a first end of the vehicle is the front end of the vehicle when traveling in a first direction, and such that the first end becomes the rear end of the vehicle when traveling in the opposite direction. Similarly, a second end of the vehicle is the front end of the vehicle when traveling in the second direction, and such that the second end becomes the rear end of the vehicle when traveling in the opposite direction. These example characteristics may facilitate greater maneuverability, for example, in small spaces or crowded environments, such as parking lots and/or urban areas.

The vehicle control system 702 can include a computing device(s) 704, one or more sensor system(s) 706, one or more emitter(s) 708, one or more communication connection(s) 710 (also referred to as communication devices and/or modems), at least one direct connection 712 (e.g., for physically coupling with the vehicle to exchange data and/or to provide power), and one or more drive system(s) 714. The one or more sensor system(s) 706 can be configured to capture sensor data associated with an environment.

The sensor system(s) 706 can include time-of-flight sensors, location sensors (e.g., GPS, compass, etc.), inertial sensors (e.g., inertial measurement units (IMUs), accelerometers, magnetometers, gyroscopes, etc.), lidar sensors, radar sensors, sonar sensors, infrared sensors, cameras (e.g., RGB, IR, intensity, depth, etc.), microphone sensors, environmental sensors (e.g., temperature sensors, humidity sensors, light sensors, pressure sensors, etc.), ultrasonic transducers, wheel encoders, etc. The sensor system(s) 706 can include multiple instances of each of these or other types of sensors. For instance, the time-of-flight sensors can include individual time-of-flight sensors located at the corners, front, back, sides, and/or top of the real or simulated vehicle associated with the vehicle control system 702. As another example, the camera sensors can include multiple cameras disposed at various locations about the exterior and/or interior of the associated real or simulated vehicle. The sensor system(s) 706 can provide input to the computing device(s) 704.

The vehicle control system 702 can also include one or more emitter(s) 708 for controller the emitting of light and/or sound via the real or simulated vehicle associated with the vehicle control system 702. The one or more emitter(s) 708 in this example include interior audio and visual emitters to communicate with passengers of the vehicle. By way of example and not limitation, interior emitters can include speakers, lights, signs, display screens, touch screens, haptic emitters (e.g., vibration and/or force feedback), mechanical actuators (e.g., seatbelt tensioners, seat positioners, headrest positioners, etc.), and the like. The one or more emitter(s) 708 in this example also include exterior emitters. By way of example and not limitation, the exterior emitters in this example include lights to signal a direction of travel or other indicator of vehicle action (e.g., indicator lights, signs, light arrays, etc.), and one or more audio emitters (e.g., speakers, speaker arrays, horns, etc.) to audibly communicate with pedestrians or other nearby vehicles, one or more of which may comprise acoustic beam steering technology.

The vehicle control system 702 can also include one or more communication connection(s) 710 that enable communication between the vehicle control system 702 and one or more other local or remote computing device(s) (e.g., a remote teleoperations computing device) or remote services. For instance, the communication connection(s) 710 can facilitate communication with other local computing device(s) on the associated real or simulated vehicle, and/or the drive system(s) 714. Also, the communication connection(s) 710 can allow the vehicle to communicate with other nearby computing device(s) (e.g., other nearby vehicles, traffic signals, etc.).

The communications connection(s) 710 can include physical and/or logical interfaces for connecting the computing device(s) 704 to another computing device or one or more external networks 716 (e.g., the Internet). For example, the communications connection(s) 710 can enable Wi-Fi-based communication such as via frequencies defined by the IEEE 802.11 standards, short range wireless frequencies such as Bluetooth, cellular communication (e.g., 2G, 3G, 4G, 4G LTE, 5G, etc.), satellite communication, dedicated short-range communications (DSRC), or any suitable wired or wireless communications protocol that enables the respective computing device to interface with the other computing device(s). In at least some examples, the communication connection(s) 710 may comprise the one or more modems as described in detail above.

In at least one example, the vehicle control system 702 can include one or more drive system(s) 714. In some examples, the real or simulated vehicle associated with the vehicle control system 702 can have a single drive system 714. In at least one example, if the vehicle has multiple drive systems 714, individual drive systems 714 can be positioned on opposite ends of the associated vehicle (e.g., the front and the rear, etc.). In at least one example, the drive system(s) 714 can include one or more sensor system(s) 706 to detect conditions of the drive system(s) 714 and/or the surroundings of the vehicle. By way of example and not limitation, the sensor system(s) 706 can include one or more wheel encoders (e.g., rotary encoders) to sense rotation of the wheels of the drive systems, inertial sensors (e.g., inertial measurement units, accelerometers, gyroscopes, magnetometers, etc.) to measure orientation and acceleration of the drive system, cameras or other image sensors, ultrasonic sensors to acoustically detect objects in the surroundings of the drive system, lidar sensors, radar sensors, etc. Some sensors, such as the wheel encoders can be unique to the drive system(s) 714. In some cases, the sensor system(s) 706 on the drive system(s) 714 can overlap or supplement corresponding systems of the vehicle control system 702 (e.g., sensor system(s) 706).

The drive system(s) 714 can include many of the vehicle systems, including a high voltage battery, a motor to propel the vehicle, an inverter to convert direct current from the battery into alternating current for use by other vehicle systems, a steering system including a steering motor and steering rack (which can be electric), a braking system including hydraulic or electric actuators, a suspension system including hydraulic and/or pneumatic components, a stability control system for distributing brake forces to mitigate loss of traction and maintain control, an HVAC system, lighting (e.g., lighting such as head/tail lights to illuminate an exterior surrounding of the vehicle), and one or more other systems (e.g., cooling system, safety systems, onboard charging system, other electrical components such as a DC/DC converter, a high voltage junction, a high voltage cable, charging system, charge port, etc.). Additionally, the drive system(s) 714 can include a drive system controller which can receive and preprocess data from the sensor system(s) 706 and to control operation of the various vehicle systems. In some examples, the drive system controller can include one or more processor(s) and memory communicatively coupled with the one or more processor(s). The memory can store one or more modules to perform various functionalities of the drive system(s) 714. Furthermore, the drive system(s) 714 also include one or more communication connection(s) that enable communication by the respective drive system with one or more other local or remote computing device(s).

The computing device(s) 704 within the vehicle control system 702 can include one or more processor(s) 718 and memory 720 communicatively coupled with the one or more processor(s) 718. In the illustrated example, the memory 720 of the computing device(s) 704 stores a localization component 722, a perception component 724, a prediction component 726, a planning component 728, and one or more system controller(s) 730. Though depicted as residing in the memory 720 for illustrative purposes, it is contemplated that the localization component 722, the perception component 724, the prediction component 726, the planning component 728, and the one or more system controller(s) 730 can additionally, or alternatively, be accessible to the computing device(s) 704 (e.g., stored in a different component of vehicle control system 702 and/or stored remotely and accessible to the vehicle control system 702.

In memory 720 of the computing device(s) 704, the localization component 722 can include functionality to receive data from the sensor system(s) 706 to determine a position of the real or simulated vehicle associated with the vehicle control system 702. For example, the localization component 722 can include and/or request/receive a three-dimensional map of the real or simulated environment and can continuously determine a location of the autonomous vehicle within the map. In some instances, the localization component 722 can use SLAM (simultaneous localization and mapping) or CLAMS (calibration, localization and mapping, simultaneously) to receive time-of-flight data, image data, lidar data, radar data, sonar data, IMU data, GPS data, wheel encoder data, or any combination thereof, and the like to accurately determine a location of the autonomous vehicle. In some instances, the localization component 722 can provide data to various components of the vehicle control system 702 to determine an initial position of an autonomous vehicle for generating a trajectory, as discussed herein.

The perception component 724 can include functionality to perform object detection, segmentation, and/or classification. In some examples, the perception component 724 can provide processed sensor data that indicates a presence of an entity that is proximate to the real or simulated vehicle associated with the vehicle control system 702 and/or a classification of the entity as an entity type (e.g., car, pedestrian, cyclist, building, tree, road surface, curb, sidewalk, unknown, etc.). In additional and/or alternative examples, the perception component 724 can provide processed sensor data that indicates one or more characteristics associated with a detected entity and/or the real or simulated environment in which the entity is positioned. In some examples, characteristics associated with an entity can include, but are not limited to, an x-position (global position), a y-position (global position), a z-position (global position), an orientation, an entity type (e.g., a classification), a velocity of the entity, an extent of the entity (size), etc. Characteristics associated with the environment can include, but are not limited to, a presence of another entity in the environment, a state of another entity in the environment, a time of day, a day of a week, a season, a weather condition, an indication of darkness/light, etc.

The perception component 724 can include functionality to store perception data generated by the perception component 724. In some instances, the perception component 724 can determine a track corresponding to an object that has been classified as an object type. For purposes of illustration only, the perception component 724, using sensor system(s) 706 can capture one or more images of a real or simulated environment. The sensor system(s) 706 can capture images of an environment that includes an object, such as a pedestrian. The pedestrian can be at a first position at a time T and at a second position at time T+t (e.g., movement during a span of time t after time T). In other words, the pedestrian can move during this time span from the first position to the second position. Such movement can, for example, be logged as stored perception data associated with the object.

The stored perception data can, in some examples, include fused perception data captured by the vehicle. Fused perception data can include a fusion or other combination of sensor data from sensor system(s) 706, such as image sensors, lidar sensors, radar sensors, time-of-flight sensors, sonar sensors, global positioning system sensors, internal sensors, and/or any combination of these. The stored perception data can additionally or alternatively include classification data including semantic classifications of objects (e.g., pedestrians, vehicles, buildings, road surfaces, etc.) represented in the sensor data. The stored perception data can additionally or alternatively include a track data (positions, orientations, sensor features, etc.) corresponding to motion of objects classified as dynamic objects through the environment. The track data can include multiple tracks of multiple different objects over time. This track data can be mined to identify images of certain types of objects (e.g., pedestrians, animals, etc.) at times when the object is stationary (e.g., standing still) or moving (e.g., walking, running, etc.). In this example, the computing device determines a track corresponding to a pedestrian.

The prediction component 726 can generate one or more probability maps representing prediction probabilities of possible locations of one or more objects in a real or simulated environment. For example, the prediction component 726 can generate one or more probability maps for vehicles, pedestrians, animals, and the like within a threshold distance from the vehicle 702. In some instances, the prediction component 726 can measure a track of an object and generate a discretized prediction probability map, a heat map, a probability distribution, a discretized probability distribution, and/or a trajectory for the object based on observed and predicted behavior. In some instances, the one or more probability maps can represent an intent of the one or more objects in the environment.

The planning component 728 can determine a path for the vehicle control system 702 to direct the real or simulated vehicle through an environment. For example, the planning component 728 can determine various routes and paths and various levels of detail. In some instances, the planning component 728 can determine a route to travel from a first location (e.g., a current location) to a second location (e.g., a target location). For the purpose of this discussion, a route can be a sequence of waypoints for traveling between two locations. As non-limiting examples, waypoints include streets, intersections, global positioning system (GPS) coordinates, etc. Further, the planning component 728 can generate an instruction for guiding the autonomous vehicle along at least a portion of the route from the first location to the second location. In at least one example, the planning component 728 can determine how to guide the autonomous vehicle from a first waypoint in the sequence of waypoints to a second waypoint in the sequence of waypoints. In some examples, the instruction can be a path, or a portion of a path. In some examples, multiple paths can be substantially simultaneously generated (i.e., within technical tolerances) in accordance with a receding horizon technique. A single path of the multiple paths in a receding data horizon having the highest confidence level may be selected to operate the vehicle.

In other examples, the planning component 728 can alternatively, or additionally, use data from the perception component 724 to determine a path for the real or simulated vehicle associated with the vehicle control system 702 to follow to traverse through an environment. For example, the planning component 728 can receive data from the perception component 724 regarding objects associated with an environment. Using this data, the planning component 728 can determine a route to travel from a first location (e.g., a current location) to a second location (e.g., a target location) to avoid objects in an environment. In at least some examples, such a planning component 728 may determine there is no such collision free path and, in turn, provide a path which brings the vehicle to a safe stop avoiding all collisions and/or otherwise mitigating damage.

As discussed above, the simulation system 732 may driving simulations, including virtual and/or log-based simulations, using the various components and systems described herein to perform techniques similar or identical to those described above in processes 500 and/or 600. The simulation system 732 may communicate/interact with one or more multiple vehicle control systems 702 to perform driving simulations in which the vehicle control systems 702 correspond to the simulated vehicle. Although not shown in this example, the simulation system 732 also may include log data store(s) similar or identical to the log data store 308, and/or simulation scenarios including simulated environments and objects similar or identical to the simulation scenarios 310, environments 312, and objects 314 described above. In some examples, log data store(s) 308 and/or simulation scenarios, environments, and objects 310-314 may be stored remotely and accessible to the simulation system 732, and/or may be stored within the memory 736 of the simulation system 732. Using one or more vehicle control systems 702, log data store(s) 308 and/or simulation scenarios, environments, and objects 310-314, the simulation system 732 may generate, instantiate, and execute driving simulations for simulated vehicles, including monitoring and receiving responses based on the simulations from vehicle control system(s) 702.

Simulation system 732 may include one or more processors 734 and memory 736 communicatively coupled with the one or more processors 734. In the illustrated example, the memory 736 of the simulation system 732 stores a virtual simulation system 738, a log-based simulation system 740, a log data component 742, an objects component 744, a scenario component 746, and a simulation component 748. Though depicted in FIG. 7 as residing in the memory 736 for illustrative purposes, it is contemplated that some or all of the systems and components 738-748 may additionally, or alternatively, be stored remotely and accessible to the simulation system 732 through networks 716.

The virtual simulation system 738 (which also may be referred to as a virtual driving simulator) within the simulation system 732 may generate and execute virtual driving simulations using similar or identical techniques to those described above in process 500. For example, the virtual simulation system 738 may receive and instantiate a number of independent components corresponding to a simulated vehicle (e.g., vehicle control system 702) and additional simulated vehicles/objects within a simulated environment. As noted above, in virtual simulations the simulated vehicle, environment, and/or other simulated objects may be implemented as separate and independent programmatic objects (e.g., artificial intelligence(s) and/or other software-based objects) that can communicate with each other and react to the simulated environment and the actions of the other simulated objects during the virtual simulation. The virtual simulation system 738 may instantiate some or all of components/systems 706-730 of the vehicle control system 702 simultaneously (or substantially simultaneously), so that these components may communicate and interact with each other, and with the simulated environment and other simulated objects, during the virtual simulation. As discussed above, log data may be collected during the execution of the virtual simulation. In some examples, the log data may correspond to a vehicle log of the vehicle control system 702, and may be captured during or after the simulation by the vehicle control system 702 itself, and/or by the virtual simulation system 738, log data component 742, or simulation component 748 within the simulation system 732.

The log-based simulation system 740 (which also may be referred to as a log-based simulator) within the simulation system 732 may generate and execute log-based driving simulations using similar or identical techniques to those described above in process 600. For example, the log-based simulation system 740 may receive log data previously collected a vehicle control system 702, or other vehicle or vehicle control system. The log data received by the log-based simulation system 740 may correspond to data captured by a vehicle control system 702 executing within a previous virtual simulation, or by a vehicle control system 702 within a vehicle traversing through a physical real-world environment. During a log-based simulation, the log-based simulation system 740 may provide simulated environment and object data, based on the log data, to a simulated vehicle (e.g., vehicle control system 702). For instance, the log-based simulation system 740 may receive and analyze the log data to detect specific objects within an environment, and the attribute data associated those objects (e.g., sizes, positions, trajectories, waypoints, etc.), and then may convert the object data into sensor data that may be transmitted to the vehicle control system 702 during execution of the log-based simulation. As discussed above, the log-based simulation system 740 also may use various techniques to determine whether a log-based simulation is valid or invalid, and when determining that a log-based simulation is invalid, may initiate a virtual driving simulation to generate new log data. For valid and/or invalid log-based simulations, the log-based simulation system 740 also may collect additional output log data associated with the vehicle simulated during the log-based simulation, and/or may evaluate the performance or actions of the simulated vehicle to determine a result or output of the simulation.

The log data component 742 of the simulation system 732 may receive and analyze log data from previous simulations and/or from a vehicle traveling within a real-world environment. For instance, the log data from a previous virtual simulation may be stored and analyzed to detect objects, attribute data, trigger points, etc. Additionally or alternatively, the log data component 742 may retrieve and select log data to be used for generating log-based simulations. As discussed above, a simulated vehicle log data store 308 may store one or more log data. In some instances, a data store 308 storing multiple log data from different vehicles and/or different trips or simulations may be stored within the simulation system 732. The log data component 742 also may scan log data stored in the data store 308 and identify log data that contains an event of interest. In some instances, the log data can include event marker(s) that indicate that an event of interest is associated with a particular log data. In some instances, a user can select a log data of a set of log data to be used to generate a simulated scenario.

The objects component 744 within the simulation system 732 can identify one or more objects associated with the log data. For example, the objects component 744 can determine objects such as vehicles, pedestrians, animals, cyclists, trees, etc. in the log data and represented as simulated objects. In some instances, the objects component 744 can determine objects that interact with the vehicle associated with the log data. For purposes of illustration only, the objects component 744 can determine that an object traversed along a trajectory that began N meters from the vehicle and continued to traverse the environment in a direction away from the vehicle. In this example, the objects component 744 may determine not to incorporate that object when generating a log-based simulation, as it did not interact with the vehicle and would not provide valuable testing/validation data.

The scenario component 746 can use the log data identified by the log data component 742 to generate a simulated scenario. The simulated scenario includes a simulated environment (e.g., roadways, road markers, buildings, etc.) and simulated objects (e.g., other vehicles, pedestrians, cyclists, animals, etc.). In some instances, the scenario component 746 can use the perception data generated by the perception component 724 to apply simulated object models to the simulated objects. For example, the scenario component 746 can identify a simulated vehicle model and apply it to the simulated objects associated with vehicles. In some instances, the scenario component 746 can identify a simulated pedestrian model and apply it to the simulated objects associated with pedestrians. In some instances, the simulated object models can use controllers that allow the simulated objects to react to the simulated environment and other simulated objects (e.g., modeling physics-based behaviors and incorporating collision checking). For example, a simulated vehicle object can stop at a crosswalk if a simulated pedestrian crosses the crosswalk as to prevent the simulated vehicle from colliding with the simulated pedestrian.

In some instances, the scenario component 746 can identify a simulated pedestrian model and apply it to the simulated objects associated with pedestrians. In some instances, the simulated object models can use controllers that allow the simulated objects to react to the simulated environment and other simulated objects (e.g., modeling physics-based behaviors and incorporating collision checking). For example, a simulated vehicle object can stop at a crosswalk if a simulated pedestrian crosses the crosswalk as to prevent the simulated vehicle from colliding with the simulated pedestrian.

In some instances, the log data can indicate that a particular object has a characteristic and apply that characteristic to the simulated object. For purposes of illustration only, the log data can indicate that an object travels at approximately 10 mph below the speed limit and accelerates slowly. The scenario component 746 can determine that the object is a cautious vehicle and apply a cautious object model to the corresponding simulated object in the simulated environment. In some instances, the scenario component 746 can determine, based on behavior data in the log data, that an object as an aggressive object, a passive object, a neutral object, and/or other types of behaviors and apply behavior instructions associated with the behavior (e.g., a passive behavior, a cautious behavior, a neutral behavior, and/or an aggressive behavior) to the simulated object.

In some instances, the scenario component 746 can use filters to remove objects represented in the log data from a simulated scenario based on attributes associated with the objects. In some instances, the scenario component 746 can filter objects based on an object/classification type (car, pedestrian, motorcycle, bicyclist, etc.), an object size (e.g., length, width, height, and/or volume), a confidence level, track length, an amount of interaction between the object and a vehicle generating the log data, and/or a time period.

By way of example and without limitation, the log data can include objects of varying sizes such as mailboxes and buildings. The scenario component 746 can use a volume-based filter such that objects that are associated with a volume greater equal to or greater than a threshold volume of three cubic meters, such as buildings, are represented in the simulated scenario and objects that are associated with a volume less than three cubic meters are not represented in the simulated scenario, such as the mailboxes. In some instances, the scenario component 746 can use a track length filter where objects that have track lengths (e.g., data associated with a physical distance or a period of time) that do not meet or exceed a track length threshold are filtered from the simulated scenario. This can result in a simulated scenario that omits objects associated with poor detections during the time of data capture. In some instances, the scenario component 746 can use a motion-based filter such that objects associated with motion or a trajectory according to the log data are represented in the simulated scenario. In some instances, the filters can be applied in combination or mutually exclusively.

In some instances, the scenario component 746 can filter objects that do not meet or exceed a confidence threshold. By way of example and without limitation, the log data can indicate that an object is associated with a classification attribute of a pedestrian and a confidence value of associated with the classification of 5 %. The scenario component 746 can have a confidence value threshold of 75% and filter the object based on the confidence value not meeting or exceeding the confidence value threshold. In some instances, a user can provide a user-generated filter that includes one or more attribute thresholds such that the scenario component 746 can filter objects that do not meet or exceed the one or more attribute thresholds indicated by the user-generated filter.

The simulation component 748 can execute the simulated scenario as a set of simulation instructions and generate simulation data. In some instances, the simulation component 748 can execute multiple simulated scenarios simultaneously and/or in parallel. This can allow a user to edit a simulated scenario and execute permutations of the simulated scenario with variations between each simulated scenario.

Additionally, the simulation component 748 can determine an outcome for the simulated scenario. For example, the simulation component 748 can execute the scenario for use in a simulation for testing and validation. The simulation component 748 generate the simulation data indicating how the vehicle control system 702 performed (e.g., responded) and can compare the simulation data to a predetermined outcome and/or determine if any predetermined rules/assertions were broken/triggered.

In some instances, the predetermined rules/assertions can be based on the simulated scenario (e.g., traffic rules regarding crosswalks can be enabled based on a crosswalk scenario or traffic rules regarding crossing a lane marker can be disabled for a stalled vehicle scenario). In some instances, the simulation component 748 can enable and disable rules/assertions dynamically as the simulation progresses. For example, as a simulated object approaches a school zone, rules/assertions related to school zones can be enabled and disabled as the simulated object departs from the school zone. In some instances, the rules/assertions can include comfort metrics that relate to, for example, how quickly an object can accelerate given the simulated scenario.

Based at least in part on determining that the vehicle control system 702 performed consistent with the predetermined outcome (that is, the autonomous controller did everything it was supposed to do) and/or determining that a rule was not broken or an assertion was not triggered, the simulation component 748 can determine that the vehicle control system 702 succeeded. Based at least in part on determining that the vehicle control system 702 performance was inconsistent with the predetermined outcome (that is, the autonomous controller did something that it wasn't supposed to do) and/or determining that a rule was broken or than an assertion was triggered, the simulation component 748 can determine that the vehicle control system 702 failed. Accordingly, based at least in part on executing the simulated scenario, simulation data can indicate how the vehicle control system 702 responds to each simulated scenario, as described above and determine a successful outcome or an unsuccessful outcome based at least in part on the simulation data.

The processor(s) 718 of the computing device(s) 704 and the processor(s) 734 of the simulation system 732 can be any suitable processor capable of executing instructions to process data and perform operations as described herein. By way of example and not limitation, the processor(s) 718 and 734 can comprise one or more Central Processing Units (CPUs), Graphics Processing Units (GPUs), or any other device or portion of a device that processes electronic data to transform that electronic data into other electronic data that can be stored in registers and/or memory. In some examples, integrated circuits (e.g., ASICs, etc.), gate arrays (e.g., FPGAs, etc.), and other hardware devices can also be considered processors in so far as they are configured to implement encoded instructions.

The memory 720 of the computing device(s) 704, and the memory 736 of the simulation system 732 are examples of non-transitory computer-readable media. The memory 720 and 736 can store an operating system and one or more software applications, instructions, programs, and/or data to implement the methods described herein and the functions attributed to the various systems. In various implementations, the memory 720 and 736 can be implemented using any suitable memory technology, such as static random access memory (SRAM), synchronous dynamic RAM (SDRAM), nonvolatile/Flash-type memory, or any other type of memory capable of storing information. The architectures, systems, and individual elements described herein can include many other logical, programmatic, and physical components, of which those shown in the accompanying figures are merely examples that are related to the discussion herein.

In some instances, aspects of some or all of the components discussed herein can include any models, algorithms, and/or machine learning algorithms. For example, any or all of the components within the memory 720 and memory 736 can be implemented as a neural network.

Figure 8:
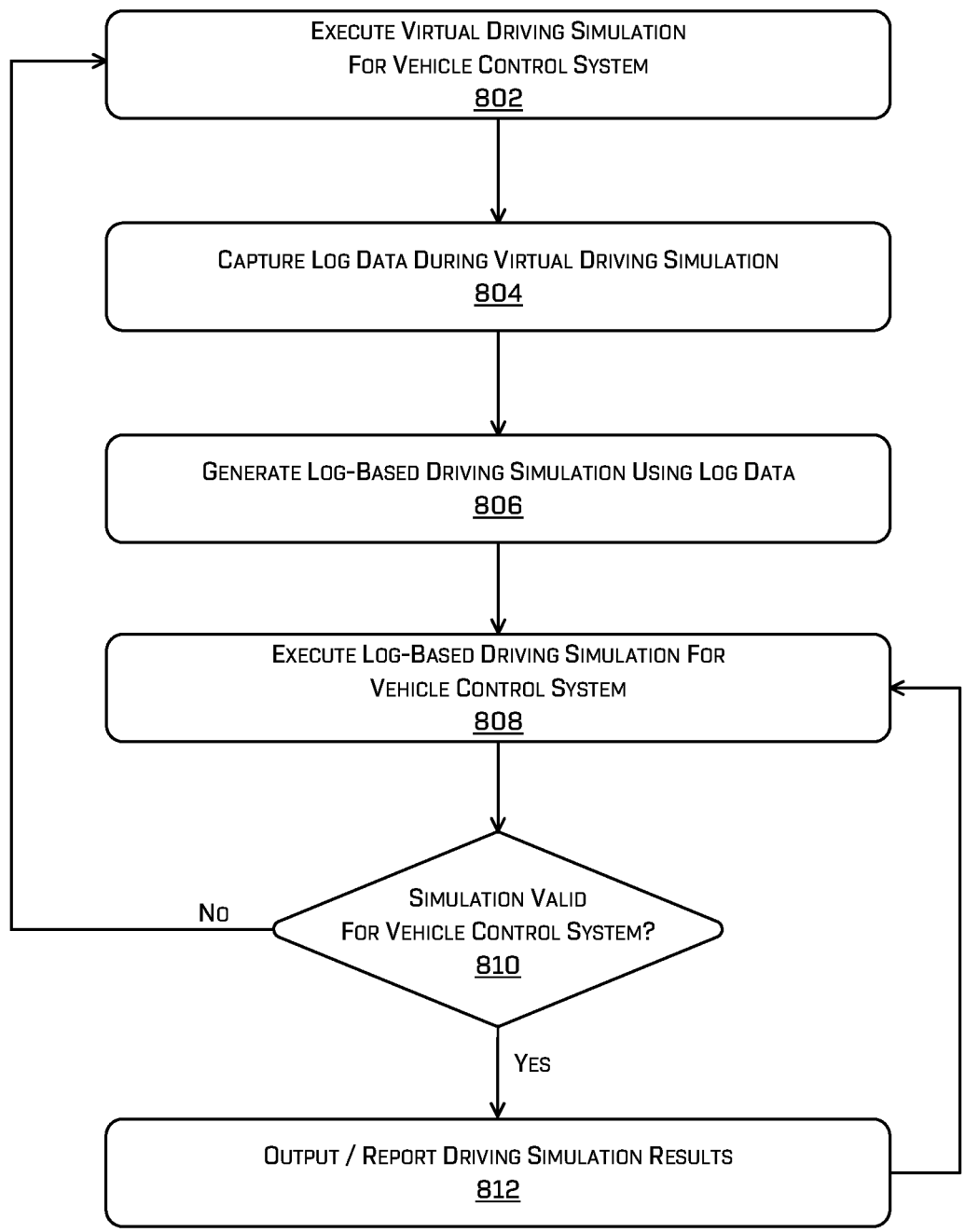
FIG. 8 illustrates an example process of executing virtual and log-based driving simulations, as described herein.

FIG. 8 illustrates an example process 800 of executing virtual and log-based driving simulations, including determining that a log-based simulation is invalid and executing a virtual simulation to generate new log data in response. The process 800 may be similar or identical to process 100 in some examples. Additionally, process 800 may include as subprocesses and/or may be associated with processes 500 and 600, which respectively describe performing virtual driving simulations and log-based driving simulations. In some instances, some or all of example process 800 may be performed by one or more components in computing architectures 300 and/or 700, as described herein. For instance, example process 800 may be described with reference to the vehicle control system 702 and the simulation device(s) 732 in FIG. 7. However, it is contemplated that process 800 can utilize computing environments and architectures other than those depicted in computing architectures 300 and 700.

At operation 802, the simulation system 732 may execute a first virtual driving simulation for the vehicle control system 702. In some examples, operation 802 may be similar or identical to operations 502 and 504 described above. For instance, simulation system 732 may receive and instantiate a number of independent software components within a shared virtual environment. The software components may correspond to a simulation environment, simulated vehicle(s) and simulated object(s) that may operate independently during execution of the virtual simulation. Each simulated vehicle and object in the virtual simulation may be implemented and controlled by an independent software component which may determine the particular attributes, behaviors, and motivations of the simulated vehicle or object, and may include artificial intelligence-based models and/or other algorithms to control the behaviors of simulated vehicles and objects during the simulation.

At operation 804, the simulation system 732 may capture log data associated with the first virtual driving simulation. In some examples, operation 804 may be similar or identical to operation 506 described above. The log data may be collected by and associated with the vehicle control system 302 during the virtual simulation, and may include the raw sensor data and/or derived data based on the sensor data. In some examples, the log data may be transmitted to a log data store 308 and/or stored within the simulation system 732.

At operation 806, the simulation system 732 may generate a log-based driving simulation scenario using the log data from the virtual simulation executed in operation 802. For instance, the simulation system 732 may use a log data component 742 to analyze the log data, detect objects and object attributes (e.g., classifications, positions, sizes, velocities, trajectories, poses, etc.), and then may use a scenario generator to generate simulation instructions to simulate the environment and objects from the virtual simulation executed at operation 802. In some examples, the process 800 may initially start at operation 806, and the log data may be obtained from a log data store 308 or other source.

At operation 808, the simulation system 732 may execute the log-based simulation generated at operation 806 for the vehicle control system 702. In some examples, operation 808 may be similar or identical to operation 606 described above. During the log-based simulation, the simulation system 732 instantiate a simulated vehicle 116 based on the vehicle control system 302, and providing input to the simulated vehicle 116 based on the simulation instructions determined based on the log data. As noted above, the log-based simulation at operation 808 need not require interactions between different software components representing the simulated environment, simulated vehicles, and simulations, and thus may be performed more efficiently and on smaller computing systems having lesser memory and computational requirements.

At operation 810, the simulation system 732 may determine whether the log-based simulation executed at operation 808 is valid or invalid for the vehicle control system 702. As discussed above, a vehicle 112 that initially collected the log data (which may be real or simulated) and simulated vehicle 116 of the log-based simulation may be controlled by different vehicle control systems 702. By way of example, the simulated vehicle 116 may comprise an updated perception component 724, updated prediction component 726, updated planning component 728, and/or sensor system(s) 706, which may cause the simulated vehicle 116 to behavior differently than the vehicle 112 that initially collected the log data. In some examples, operation 810 may be similar or identical to operation 106 described above. For instance, the simulation system 732 may determine a distance between the simulated vehicle 116 from the log-based simulation, and the corresponding vehicle 112 from which the log data was collected during the virtual simulation. In other examples, the simulation system 732 may use any of the various techniques described herein, individually or in any combination, to determine if the log-based simulation generated at operation 808 is invalid.

In response to determining that the log-based simulation executed at operation 808 is valid (810:Yes), the simulation system 732 may output or report the results of the simulation in operation 812. Process 800 then may return to operation 808 to perform additional executions of the same log-based simulation.

In contrast, in response to determining that the log-based simulation executed at operation 808 is invalid (810:No), process 800 may return to operation 802 to execute a new virtual simulation. In some examples, a log-based simulation may be determined invalid during operation 810 based on changes or updates to the vehicle control system 702 that were performed between the initial virtual simulation at 802 and the current iteration of the log-based simulation at 808. Accordingly, when returning to operation 802, the simulation system 732 may re-executed the same virtual simulation (e.g., identical simulated environment, simulated objects, etc.) using the current updated version of the vehicle control system 702, and generating new/updated log data associated with the updated version of the vehicle control system 702.

In some examples, a manual validity review by a human operator may be required to confirm that a log-based simulation is invalid. In such examples, the simulation system 732 may also initiate the manual validity review (e.g., by transmitting a notification and simulation data to a simulation administrator or other human operator) in response to the determination that the log-based simulation is invalid (810:No). In some instances, to defer to higher costs and delays of a manual review, the simulation system 732 may first attempt to update the log-based simulation by performing a second iteration of operations 802-806, and then may initiate the manual review of the log-based simulation in response to a second determination that the new/updated log-based simulation is invalid (810:No) on the second iteration of process 800.

EXAMPLE CLAUSES

A. A system comprising: one or more processors; and one or more computer-readable media storing computer-executable instructions that, when executed, cause the one or more processors to perform operations comprising: receiving first log data associated with an autonomous vehicle traversing an environment; generating, based at least in part on the first log data, a first driving simulation comprising a first simulated vehicle controlled by a vehicle controller; determining that the first driving simulation is invalid; generating, based at least in part on determining the first driving simulation is invalid, a second driving simulation comprising a second simulated vehicle controlled by the vehicle controller; generating second log data, based at least in part on the second driving simulation; generating, based at least in part on the second log data, a third driving simulation comprising a third simulated vehicle controlled by the vehicle controller; and determining a response by the vehicle controller to the third driving simulation.

B. The system of paragraph A, wherein determining that the first driving simulation is invalid comprises: determining a distance between a location of the autonomous vehicle in the first log data and a corresponding location of the first simulated vehicle in the first driving simulation; and determining that the distance meets or exceeds a threshold distance.

C. The system of any one of paragraphs A-B, wherein determining that the first driving simulation is invalid comprises at least one of: comparing a first bidirectional state of the autonomous vehicle in the first log data, and a second bidirectional state of the first simulated vehicle in the first driving simulation; comparing a first orientation of the autonomous vehicle in the first log data, and a second orientation of the first simulated vehicle in the first driving simulation; or comparing a first sensor configuration of the autonomous vehicle in the first log data, and a second sensor configuration of the first simulated vehicle in the first driving simulation.

D. The system of any one of paragraphs A-C, wherein executing the first driving simulation comprises sequentially executing a first component and a second component of the vehicle controller, and wherein executing the second driving simulation comprises substantially simultaneously executing the first component and the second component of the vehicle controller.

E. The system of any one of paragraphs A-D, wherein the autonomous vehicle is a simulated vehicle, and wherein the first log data is captured by a controller of the autonomous vehicle while the autonomous vehicle is traversing a virtual environment.

F. A method comprising: receiving first log data associated with a first vehicle; generating, based at least in part on the first log data, a first driving simulation; determining that the first driving simulation is invalid; generating a second driving simulation, based at least in part on determining that the first driving simulation is invalid; and generating second log data, based at least in part on the second driving simulation.

G. The method of paragraph F, wherein the first log data is captured by a first vehicle controller, and wherein the first log data is associated with at least one of: a previous driving simulation comprising a simulated vehicle representative of the first vehicle controller; or a vehicle associated with the first vehicle controller traversing an environment.

H. The method of any one of paragraphs F-G, wherein determining that the first driving simulation is invalid comprises: determining a distance between a first location of the first vehicle in the first log data, and a second location of a simulated vehicle in the first driving simulation; and determining that the distance meets or exceeds a threshold distance.

I. The method of any one of paragraphs F-H, wherein determining that the first driving simulation is invalid comprises at least one of: comparing a first bidirectional state of the first vehicle in the first log data, and a second bidirectional state of a simulated vehicle in the first driving simulation; comparing a first orientation of the first vehicle in the first log data, and a second orientation of the simulated vehicle in the first driving simulation; or comparing a first sensor configuration of the first vehicle in the first log data, and a second sensor configuration of the simulated vehicle in the first driving simulation.

J. The method of any one of paragraphs F-I, wherein the first driving simulation comprises a first simulated vehicle controlled by a vehicle controller, wherein generating the first driving simulation comprises sequentially executing a first component and a second component of the vehicle controller, and wherein generating the second driving simulation comprises substantially simultaneously executing the first component and the second component of the vehicle controller.

K. The method of any one of paragraphs F-J, wherein the first driving simulation comprises a first simulated vehicle controlled by a vehicle controller, and the second driving simulation comprises a second simulated vehicle controlled by the vehicle controller, wherein generating the first driving simulation comprises retrieving the first log data and simulating perception data for the first simulated vehicle based at least in part on the first log data, and wherein generating the second driving simulation comprises simulating the second simulated vehicle in a virtual environment, and capturing the second log data using a perception component of the vehicle controller as the second simulated vehicle traverses the virtual environment.

L. The method of any one of paragraphs F-K, wherein the first driving simulation comprises a first simulated vehicle controlled by a first vehicle controller, and the second driving simulation comprises a second simulated vehicle controlled by a second vehicle controller, wherein a first planning component of the first vehicle controller is different than a second planning component of the second vehicle controller.

M. The method of any one of paragraphs F-L, wherein the first driving simulation comprises a first simulated vehicle controlled by a vehicle controller, and the second driving simulation comprises a second simulated vehicle controlled by the vehicle controller wherein generating the first driving simulation comprises instantiating a first object based at least in part on the first log data, wherein a first behavior of the first object is determined based at least in part on the first log data, and wherein the generating the second driving simulation comprises instantiating a second object associated with the first object, wherein a second behavior of the second object based at least in part on an action of the vehicle controller.

N. One or more non transitory computer readable media storing instructions executable by a processor, wherein the instructions, when executed, cause the processor to perform operations comprising: receiving first log data associated with a first vehicle; generating, based at least in part on the first log data, a first driving simulation; determining that the first driving simulation is invalid; generating a second driving simulation, based at least in part on determining that that the first driving simulation is invalid; and generating second log data, based at least in part on the second driving simulation.

O. The one or more non transitory computer readable media of paragraph N, wherein the first log data is captured by a first vehicle controller, and wherein the first log data is associated with at least one of: a previous driving simulation comprising a simulated vehicle representative of the first vehicle controller; or a vehicle associated with the first vehicle controller traversing an environment.

P. The one or more non transitory computer readable media of any one of paragraphs N-O, wherein determining that the first driving simulation is invalid comprises: determining a distance between a first location of the first vehicle in the first log data, and a second location of a simulated vehicle in the first driving simulation; and determining that the distance meets or exceeds a threshold distance.

Q. The one or more non transitory computer readable media of any one of paragraphs N-P, wherein determining that the first driving simulation is invalid comprises at least one of: comparing a first bidirectional state of the first vehicle in the first log data, and a second bidirectional state of a simulated vehicle in the first driving simulation; comparing a first orientation of the first vehicle in the first log data, and a second orientation of the simulated vehicle in the first driving simulation; or comparing a first sensor configuration of the first vehicle in the first log data, and a second sensor configuration of the simulated vehicle in the first driving simulation.

R. The one or more non transitory computer readable media of any one of paragraphs N-Q, wherein the first driving simulation comprises a first simulated vehicle controlled by a vehicle controller, wherein generating the first driving simulation comprises sequentially executing a first component and a second component of the vehicle controller, and wherein generating the second driving simulation comprises substantially simultaneously executing the first component and the second component of the vehicle controller.

S. The one or more non transitory computer readable media of any one of paragraphs N-R, wherein the first driving simulation comprises a first simulated vehicle controlled by a vehicle controller, and the second driving simulation comprises a second simulated vehicle controlled by the vehicle controller, wherein generating the first driving simulation comprises retrieving the first log data and simulating perception data for the first simulated vehicle based at least in part on the first log data, and wherein generating the second driving simulation comprises simulating the second simulated vehicle in a virtual environment, and capturing the second log data using a perception component of the vehicle controller as the second simulated vehicle traverses the virtual environment.

T. The one or more non transitory computer readable media of any one of paragraphs N-S, wherein the first driving simulation comprises a first simulated vehicle controlled by a first vehicle controller, and the second driving simulation comprises a second simulated vehicle controlled by a second vehicle controller, wherein a first planning component of the first vehicle controller is different than a second planning component of the second vehicle controller.

While the example clauses described above are described with respect to particular implementations, it should be understood that, in the context of this document, the content of the example clauses can be implemented via a method, device, system, a computer-readable medium, and/or another implementation. Additionally, any of examples A-T may be implemented alone or in combination with any other one or more of the examples A-T.

CONCLUSION

While one or more examples of the techniques described herein have been described, various alterations, additions, permutations and equivalents thereof are included within the scope of the techniques described herein.

In the description of examples, reference is made to the accompanying drawings that form a part hereof, which show by way of illustration specific examples of the claimed subject matter. It is to be understood that other examples may be used and that changes or alterations, such as structural changes, may be made. Such examples, changes or alterations are not necessarily departures from the scope with respect to the intended claimed subject matter. While the steps herein may be presented in a certain order, in some cases the ordering may be changed so that certain inputs are provided at different times or in a different order without changing the function of the systems and methods described. The disclosed procedures could also be executed in different orders. Additionally, various computations that are herein need not be performed in the order disclosed, and other examples using alternative orderings of the computations could be readily implemented. In addition to being reordered, the computations could also be decomposed into sub-computations with the same results.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

The components described herein represent instructions that may be stored in any type of computer-readable medium and may be implemented in software and/or hardware. All of the methods and processes described above may be embodied in, and fully automated via, software code modules and/or computer-executable instructions executed by one or more computers or processors, hardware, or some combination thereof. Some or all of the methods may alternatively be embodied in specialized computer hardware.

Conditional language such as, among others, "may," "could," "may" or "might," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or any combination thereof, including multiples of each element. Unless explicitly described as singular, "a" means singular and plural.

Any routine descriptions, elements or blocks in the flow diagrams described herein and/or depicted in the attached figures should be understood as potentially representing modules, segments, or portions of code that include one or more computer-executable instructions for implementing specific logical functions or elements in the routine. Alternate implementations are included within the scope of the examples described herein in which elements or functions may be deleted, or executed out of order from that shown or discussed, including substantially synchronously, in reverse order, with additional operations, or omitting operations, depending on the functionality involved as would be understood by those skilled in the art.

Many variations and modifications may be made to the above-described examples, the elements of which are to be understood as being among other acceptable examples. All such modifications and variations are intended to be included herein within the scope of this disclosure and protected by the following claims.

What is claimed is:

1. A system comprising:
  one or more processors; and
  one or more computer-readable media storing computer-executable instructions that, when executed, cause the one or more processors to perform operations comprising:
    receiving first log data associated with an autonomous vehicle traversing an environment;
    executing a first driving simulation, wherein executing the first driving simulation comprises:
      instantiating, within a simulation system, a simulated driving environment based at least in part on the first log data;
      controlling a first simulated vehicle within the simulated driving environment using a vehicle controller; and
      determining, by the simulation system, a behavior of the first simulated vehicle within the simulated driving environment;
      determining, based at least in part on the behavior of the first simulated vehicle, that the first driving simulation is invalid;
    executing, based at least in part on determining the first driving simulation is invalid, a second driving simulation comprising a second simulated vehicle controlled by the vehicle controller;
    generating second log data, based at least in part on executing the second driving simulation;
    executing, based at least in part on the second log data, a third driving simulation comprising a third simulated vehicle controlled by the vehicle controller; and
    determining a response by the vehicle controller to the third driving simulation.

2. The system of claim 1, wherein determining that the first driving simulation is invalid comprises:
  determining a distance between a location of the autonomous vehicle in the first log data and a corresponding location of the first simulated vehicle in the first driving simulation; and
  determining that the distance meets or exceeds a threshold distance.

3. The system of claim 1, wherein determining that the first driving simulation is invalid comprises at least one of:
  comparing a first bidirectional state of the autonomous vehicle in the first log data, and a second bidirectional state of the first simulated vehicle in the first driving simulation;
  comparing a first orientation of the autonomous vehicle in the first log data, and a second orientation of the first simulated vehicle in the first driving simulation; or
  comparing a first sensor configuration of the autonomous vehicle in the first log data, and a second sensor configuration of the first simulated vehicle in the first driving simulation.

4. The system of claim 1, wherein executing the first driving simulation comprises sequentially executing a first component and a second component of the vehicle controller, and
  wherein executing the second driving simulation comprises concurrently executing the first component and the second component of the vehicle controller.

5. The system of claim 1, wherein the autonomous vehicle is a simulated vehicle, and wherein the first log data is captured by a controller of the autonomous vehicle while the autonomous vehicle is traversing a virtual environment.

6. A method comprising:
  receiving first log data associated with a first vehicle;
  executing a first driving simulation, wherein executing the first driving simulation comprises:
    instantiating, within a simulation system, a simulated driving environment based at least in part on the first log data;
    controlling, using a vehicle controller, a simulated vehicle within the simulated driving environment; and
    determining, by the simulation system, a behavior of the simulated vehicle within the simulated driving environment;
  determining, based at least in part on the behavior of the simulated vehicle, that the first driving simulation is invalid;
  executing a second driving simulation, based at least in part on determining that the first driving simulation is invalid; and
  generating second log data, based at least in part on executing the second driving simulation.

7. The method of claim 6, wherein the first log data is captured by a first vehicle controller, and wherein the first log data is associated with at least one of:
  a previous driving simulation comprising a simulated vehicle representative of the first vehicle controller; or
  a vehicle associated with the first vehicle controller traversing an environment.

8. The method of claim 6, wherein determining that the first driving simulation is invalid comprises:
  determining a distance between a first location of the first vehicle in the first log data, and a second location of the simulated vehicle in the first driving simulation; and
  determining that the distance meets or exceeds a threshold distance.

9. The method of claim 6, wherein determining that the first driving simulation is invalid comprises at least one of:
  comparing a first bidirectional state of the first vehicle in the first log data, and a second bidirectional state of the simulated vehicle in the first driving simulation;

comparing a first orientation of the first vehicle in the first log data, and a second orientation of the simulated vehicle in the first driving simulation; or comparing a first sensor configuration of the first vehicle in the first log data, and a second sensor configuration of the simulated vehicle in the first driving simulation.

10. The method of claim 6,
wherein executing the first driving simulation comprises sequentially executing a first component and a second component of the vehicle controller, and
wherein generating the second driving simulation comprises concurrently executing the first component and the second component of the vehicle controller.

11. The method of claim 6, wherein executing the second driving simulation comprises controlling a second simulated vehicle using the vehicle controller,
wherein executing the first driving simulation comprises retrieving the first log data and simulating perception data for the simulated vehicle based at least in part on the first log data, and
wherein executing the second driving simulation comprises controlling the second simulated vehicle in a virtual environment, and capturing the second log data using a perception component of the vehicle controller as the second simulated vehicle traverses the virtual environment.

12. The method of claim 6, wherein executing the first driving simulation comprises controlling the simulated vehicle using the vehicle controller, and wherein executing the second driving simulation comprises controlling a second simulated vehicle using a second vehicle controller, wherein a first planning component of the vehicle controller is different than a second planning component of the second vehicle controller.

13. The method of claim 6, wherein executing the second driving simulation comprises controlling a second simulated vehicle using the vehicle controller
wherein generating the first driving simulation comprises instantiating a first object based at least in part on the first log data, wherein a first behavior of the first object is determined based at least in part on the first log data, and
wherein the generating the second driving simulation comprises instantiating a second object associated with the first object, wherein a second behavior of the second object based at least in part on an action of the vehicle controller.

14. One or more non-transitory computer-readable media storing instructions executable by a processor, wherein the instructions, when executed, cause the processor to perform operations comprising:
receiving first log data associated with a first vehicle;
executing a first driving simulation, wherein executing the first driving simulation comprises:
instantiating, within a simulation system, a simulated driving environment based at least in part on the first log data;
controlling, using a vehicle controller, a simulated vehicle within the simulated driving environment; and
determining, by the simulation system, a behavior of the simulated vehicle within the simulated driving environment;
determining, based at least in part on the behavior of the simulated vehicle, that the first driving simulation is invalid;

executing a second driving simulation, based at least in part on determining that the first driving simulation is invalid; and
generating second log data, based at least in part on executing the second driving simulation.

15. The one or more non-transitory computer-readable media of claim 14, wherein the first log data is captured by a first vehicle controller, and wherein the first log data is associated with at least one of:
a previous driving simulation comprising a simulated vehicle representative of the first vehicle controller; or
a vehicle associated with the first vehicle controller traversing an environment.

16. The one or more non-transitory computer-readable media of claim 14, wherein determining that the first driving simulation is invalid comprises:
determining a distance between a first location of the first vehicle in the first log data, and a second location of the simulated vehicle in the first driving simulation; and
determining that the distance meets or exceeds a threshold distance.

17. The one or more non-transitory computer-readable media of claim 14, wherein determining that the first driving simulation is invalid comprises at least one of:
comparing a first bidirectional state of the first vehicle in the first log data, and a second bidirectional state of the simulated vehicle in the first driving simulation;
comparing a first orientation of the first vehicle in the first log data, and a second orientation of the simulated vehicle in the first driving simulation; or
comparing a first sensor configuration of the first vehicle in the first log data, and a second sensor configuration of the simulated vehicle in the first driving simulation.

18. The one or more non-transitory computer-readable media of claim 14, wherein executing the first driving simulation comprises sequentially executing a first component and a second component of the vehicle controller, and
wherein generating the second driving simulation comprises concurrently executing the first component and the second component of the vehicle controller.

19. The one or more non-transitory computer-readable media of claim 14, wherein executing the second driving simulation comprises controlling a second simulated vehicle using the vehicle controller,
wherein executing the first driving simulation comprises retrieving the first log data and simulating perception data for the simulated vehicle based at least in part on the first log data, and
wherein executing the second driving simulation comprises controlling the second simulated vehicle in a virtual environment, and capturing the second log data using a perception component of the vehicle controller as the second simulated vehicle traverses the virtual environment.

20. The one or more non-transitory computer-readable media of claim 14, wherein executing the first driving simulation comprises controlling the simulated vehicle using the vehicle controller, and wherein executing the second driving simulation comprises controlling a second simulated vehicle using a second vehicle controller, wherein a first planning component of the vehicle controller is different than a second planning component of the second vehicle controller.

* * * * *